United States Patent
Morita

(10) Patent No.: US 10,937,382 B2
(45) Date of Patent: Mar. 2, 2021

(54) DISPLAY DRIVER, ELECTRO-OPTICAL DEVICE, AND ELECTRONIC APPARATUS

(71) Applicant: SEIKO EPSON CORPORATION, Tokyo (JP)

(72) Inventor: Akira Morita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/708,535

(22) Filed: Dec. 10, 2019

(65) Prior Publication Data
US 2020/0184916 A1 Jun. 11, 2020

(30) Foreign Application Priority Data
Dec. 11, 2018 (JP) .............................. JP2018-231291

(51) Int. Cl.
| | |
|---|---|
| G09G 3/36 | (2006.01) |
| H03F 3/45 | (2006.01) |
| H03M 1/80 | (2006.01) |
| H03F 1/34 | (2006.01) |

(52) U.S. Cl.
CPC ......... *G09G 3/3685* (2013.01); *G09G 3/3614* (2013.01); *H03F 1/34* (2013.01); *H03F 3/45071* (2013.01); *H03M 1/808* (2013.01); *G09G 2310/027* (2013.01); *G09G 2310/0291* (2013.01); *G09G 2320/0693* (2013.01); *H03F 2203/45151* (2013.01); *H03F 2203/45336* (2013.01)

(58) Field of Classification Search
CPC ............... G09G 3/3685; G09G 3/3614; G09G 2320/0693; G09G 2310/027; G09G 2310/0291; G09G 3/3688; H03F 3/45071; H03F 1/34; H03F 2203/45151; H03F 2203/45336; H03M 1/808
See application file for complete search history.

(56) References Cited

U.S. PATENT DOCUMENTS

| | | | | |
|---|---|---|---|---|
| 6,046,719 A | * | 4/2000 | Dingwall | G09G 3/2011 345/100 |
| 6,160,533 A | * | 12/2000 | Tamai | G09G 3/2011 345/89 |
| 6,275,207 B1 | * | 8/2001 | Nitta | G09G 3/2011 345/89 |

(Continued)

FOREIGN PATENT DOCUMENTS

| | | |
|---|---|---|
| JP | 2007-279186 A | 10/2007 |
| JP | 2016-138957 A | 8/2016 |
| WO | 99/00786 A1 | 1/1999 |

*Primary Examiner* — Grant Sitta
(74) *Attorney, Agent, or Firm* — Oliff PLC

(57) ABSTRACT

A display driver includes a D/A converter circuit for outputting a gradation voltage, and an amplifier circuit that is input with a gradation voltage at an input node. The amplifier circuit includes an operational amplifier, resistance provided between the input node and a node, resistance provided between a node and an output node of the operational amplifier, and an adjustment resistance circuit. The adjustment resistance circuit adjusts a first adjustment resistance value, that is a resistance value between a node and an inverting input node of the operational amplifier, and a second adjustment resistance value, that is a resistance value between the node and the inverting input node.

12 Claims, 11 Drawing Sheets

(56) References Cited

U.S. PATENT DOCUMENTS

| | | | |
|---|---|---|---|
| 6,452,526 B2* | 9/2002 | Sagawa | G09G 3/3685 341/100 |
| 7,079,127 B2* | 7/2006 | Morita | G09G 3/2011 345/210 |
| 7,965,131 B2* | 6/2011 | Tomita | G09G 3/3696 327/538 |
| 8,242,944 B2* | 8/2012 | Umeda | H03M 1/682 341/145 |
| 8,581,824 B2* | 11/2013 | Baek | H03M 1/687 345/100 |
| 2001/0040519 A1 | 11/2001 | Sagawa et al. | |
| 2002/0008686 A1* | 1/2002 | Kumada | G09G 3/3655 345/94 |
| 2002/0126112 A1* | 9/2002 | Kato | G09G 3/3685 345/204 |
| 2005/0212735 A1* | 9/2005 | Lin | G09G 3/3655 345/87 |
| 2005/0285834 A1* | 12/2005 | Nakata | G09G 3/3696 345/88 |
| 2006/0119739 A1* | 6/2006 | Chang | H04N 5/202 348/650 |
| 2006/0181494 A1* | 8/2006 | Morita | G09G 3/3696 345/89 |
| 2006/0181544 A1* | 8/2006 | Morita | G09G 3/3688 345/600 |
| 2006/0214900 A1* | 9/2006 | Tsuchi | H03M 1/661 345/98 |
| 2006/0244645 A1* | 11/2006 | Ozalevli | H03M 1/808 341/144 |
| 2007/0216633 A1* | 9/2007 | Kim | H03M 1/68 345/100 |
| 2007/0241820 A1 | 10/2007 | Hashimoto et al. | |
| 2008/0266231 A1* | 10/2008 | Umeda | G09G 3/3696 345/95 |
| 2016/0104411 A1* | 4/2016 | Nathan | G09G 3/3283 345/690 |
| 2016/0155381 A1* | 6/2016 | Kwon | G09G 3/3233 345/215 |
| 2016/0217759 A1 | 7/2016 | Morita | |
| 2016/0247482 A1* | 8/2016 | Zeng | G09G 5/10 |

* cited by examiner

_(12)_ United States Patent

DISPLAY DRIVER, ELECTRO-OPTICAL DEVICE, AND ELECTRONIC APPARATUS

The present application is based on, and claims priority from JP Application Serial Number 2018-231291, filed Dec. 11, 2018, the disclosure of which is hereby incorporated by reference herein in its entirety.

BACKGROUND

1. Technical Field

The present disclosure relates to a display driver, an electro-optical device, and an electronic apparatus.

2. Related Art

A display driver for driving an electro-optical panel includes a ladder resistance circuit for generating a plurality of voltages, a D/A converter circuit for selecting a gradation voltage corresponding to display data from the plurality of voltages, and an amplifier circuit for amplifying or buffering the gradation voltage. A related technology of such a display driver is disclosed in, for example, JP-A-2016-138957. In FIG. 10 of JP-A-2016-138957, a configuration is disclosed in which a D/A converter circuit is constituted by a resistor string and a switching array, an output of the D/A converter circuit is input to a voltage follower, and a voltage follower circuit drives a data line of an electro-optical panel.

In recent years, a display driver to drive a pixel at high speed within a short driving period is desired for high definition and a high frame rate of an electro-optical panel. Thus, by increasing a gain of an operational amplifier used in an amplifier circuit, the amplifier circuit changes a data voltage at high speed. However, when the voltage follower circuit as in JP-A-2016-138957 is adopted, a bias point of a differential pair of the operational amplifier fluctuates in accordance with gradation. A gain of a differential pair generally fluctuates when a bias point fluctuates. Thus, it is difficult to achieve a high gain over the entire fluctuation range of the bias point. A technique using a resistor type inverting amplifier circuit as an amplifier circuit is conceivable, for example, to reduce the fluctuation of the bias point of the differential pair.

In the resistor type inverting amplifier circuit, a ratio of input resistance to feedback resistance determines gain. A display driver is provided with a plurality of amplifier circuits, but there is a problem in that gains vary among the amplifier circuits due to process variation in resistors. When gains vary among amplifier circuits, variation in data voltages among the amplifier circuits occurs even for identical gradation. This variation in data voltages may cause image quality reduction, for example.

SUMMARY

An aspect of the present disclosure relates to A display driver that includes a D/A converter circuit configured to convert display data to a gradation voltage, and an amplifier circuit that is input with the gradation voltage at an input node, and outputs a data voltage, wherein the amplifier circuit includes an operational amplifier that is input with a reference voltage at a non-inverting input node, an adjustment resistance circuit provided between the input node and an inverting input node of the operational amplifier, a first resistance provided between the input node and a first node of the adjustment resistance, and a second resistance provided between a second node of the adjustment resistance and an output node of the operational amplifier, the adjustment resistance circuit configured to adjust a first adjustment resistance value that is a resistance value between the first node and the inverting input node of the operational amplifier, and a second adjustment resistance value that is a resistance value between the second node and the inverting input node of the operational amplifier.

DESCRIPTION OF EXEMPLARY EMBODIMENTS

Preferable exemplary embodiments of the present disclosure will be described in detail hereinafter. Note that the exemplary embodiments described hereinafter are not intended to unjustly limit the content of the present disclosure as set forth in the claims, and all of the configurations described in the exemplary embodiments are not always required to solve the issues described in the present disclosure.

1. Display Driver

Figure 1:
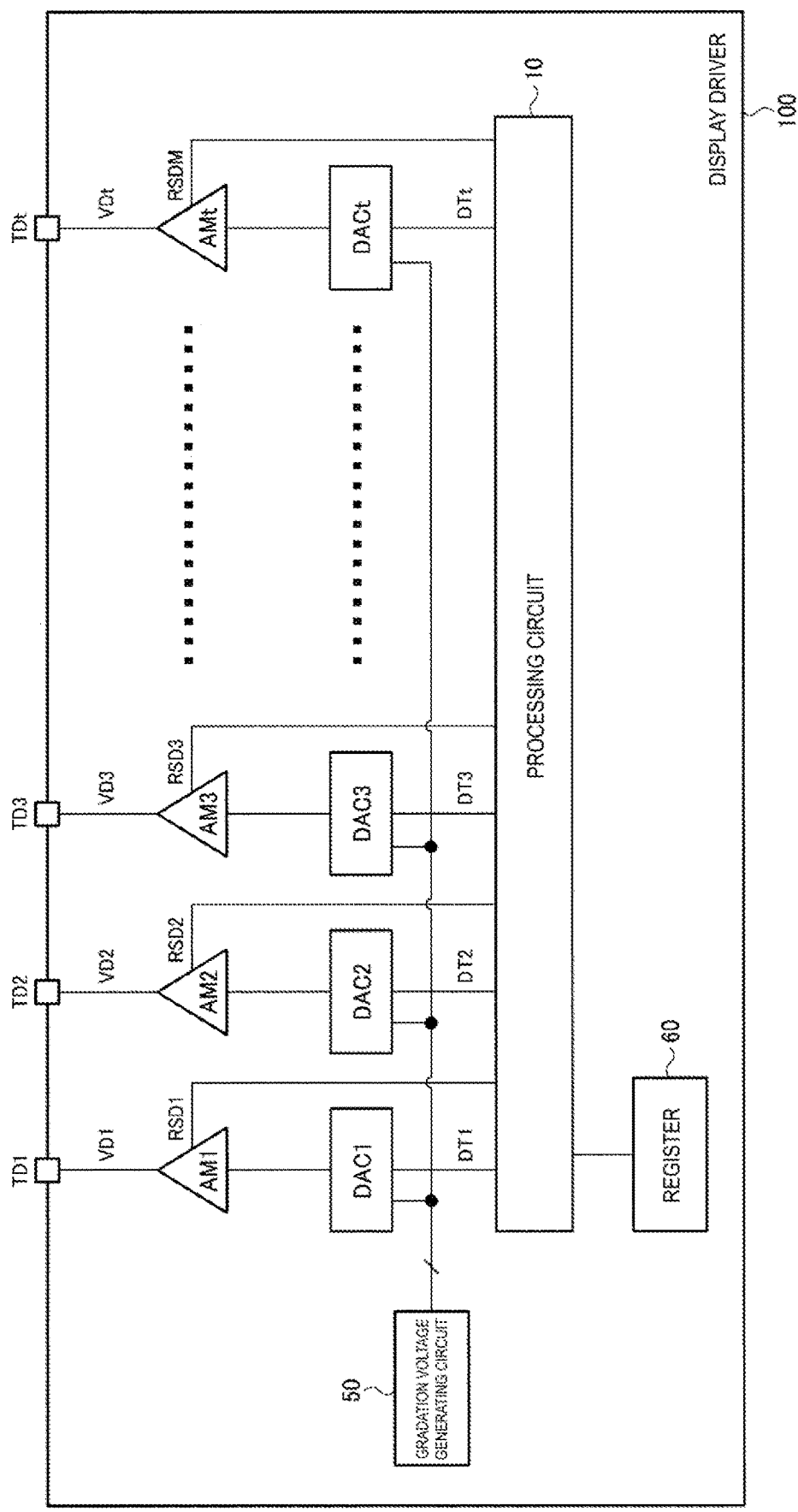
FIG. 1 illustrates a configuration example of a display driver.

FIG. 1 illustrates a configuration example of a display driver 100. The display driver 100 in FIG. 1 supplies a data voltage to a pixel of an electro-optical panel to drive the electro-optical panel. As the electro-optical panel, for example, an active matrix type liquid crystal display panel, or an Electro Luminescence (EL) panel can be assumed. The display driver 100 is an integrated circuit device.

The display driver 100 includes data voltage output terminals TD1 to TDn that are first to n-th data voltage output terminals respectively, amplifier circuits AM1 to AMt, D/A converter circuits DAC1 to DACt, a processing circuit 10, a gradation voltage generation circuit 50, and a register 60. t is an integer equal to or greater than 3.

The processing circuit 10 outputs display data DT1 to the D/A converter circuit DAC1. Similarly, the processing circuit 10 outputs display data DT2 to DTt to the D/A converter circuits DAC2 to DACt, respectively. Furthermore, the processing circuit 10 controls each unit of the display driver 100. For example, the processing circuit 10 performs timing control when the display driver 100 drives the electro-optical panel. Alternatively, the processing circuit 10 outputs gain adjustment data RSD1 to RSDt to the amplifier circuits AM1 to AMt, respectively, based on gain adjustment information stored in the register 60. Gains of the amplifier circuits AM1 to AMt are set by the gain adjustment data RSD1 to RSDt, respectively. The processing circuit 10 is a logic circuit. A logic circuit includes logic elements and signal lines coupling the logic elements, and a function of the logic circuit is realized by the logic elements and the signal lines. Alternatively, the processing circuit 10 may be a processor such as a Digital Signal Processor (DSP). In this case, the processor executes a program in which a function of the processing circuit 10 is described, thereby realizing the function of the processing circuit 10.

The D/A converter circuit DAC1 performs D/A conversion to convert the display data DT1 to a voltage corresponding to the display data DT1. Specifically, the D/A converter circuit DAC1 selects a gradation voltage corresponding to the display data DT1 from among a plurality of gradation voltages generated by the gradation voltage generation circuit 50. Similarly, the D/A converter circuits DAC2 to DACn perform the D/A conversion to convert the display data DT2 to DTn to voltages corresponding to the display data DT2 to DTn, respectively. Each of the D/A converter circuits DAC1 to DACn is, for example, a selector constituted by a transistor switch.

The amplifier circuit AM1 inverts and amplifies a voltage output from the D/A converter circuit DAC1, and outputs a result thereof to the data voltage output terminal TD1 as a data voltage VD1. Similarly, the amplifier circuits AM2 to AMt invert and amplify voltages output from the D/A converter circuits DAC2 to DACt, respectively, and a result thereof is output to the data voltage output terminals TD2 to TDt as data voltages VD2 to VDt, respectively.

The data voltage output terminals TD1 to TDt are pads formed on a semiconductor substrate of an integrated circuit device, or terminals provided on a package of an integrated circuit device. The data voltage output terminals TD1 to TDt are aligned along a long side direction of the display driver 100. Each of the data voltage output terminals TD1 to TDt is coupled to a data voltage input terminal of the electro-optical panel via wiring, a cable, or the like on a circuit board.

Figure 2:
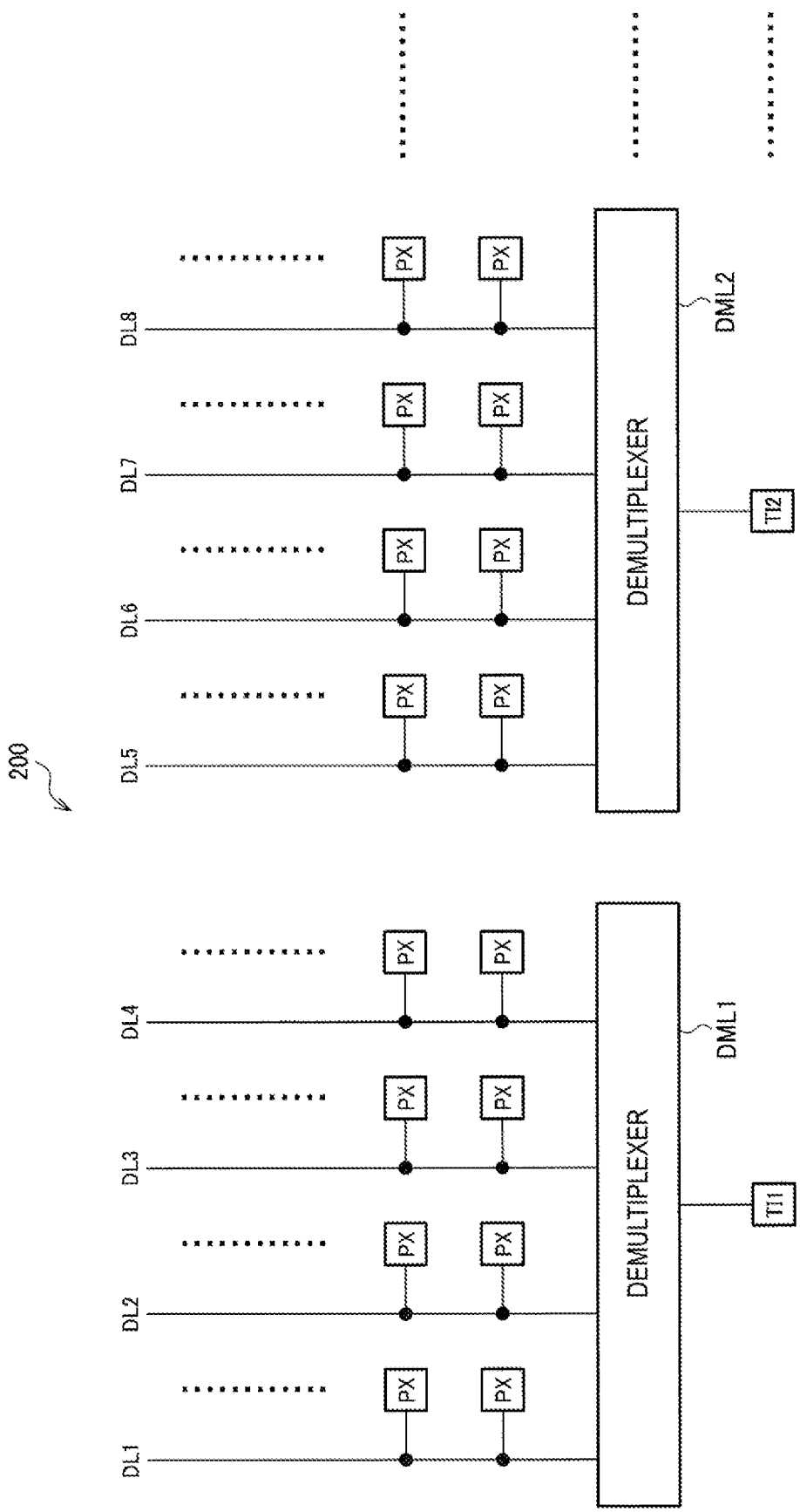
FIG. 2 illustrates an example configuration of an electro-optical panel.

FIG. 2 illustrates an example configuration of an electro-optical panel 200 driven by the display driver 100. The electro-optical panel 200 includes data voltage input terminals TI1, TI2, a demultiplexers DML1, DML2, data lines DL1 to DL8, and a plurality of pixels PX. Although only a portion coupled to the data voltage input terminals TI1 and TI2 is illustrated in FIG. 2, a portion coupled to the data voltage input terminal TI3 and the following data voltage input terminals have a similar configuration.

Operation of the display driver 100 and the electro-optical panel 200 will be described with reference to FIG. 1 and FIG. 2. Here, operation of the display driver 100 for the data voltage VD1 will be described as an example, but the operation of the display driver 100 is similar for the data voltages VD1 to VDt. In addition, a case where the display driver 100 performs demultiplex driving with a multiplicity of 4 will be described as an example, but it is sufficient that the multiplicity is 2 or greater.

The processing circuit 10 outputs first to fourth display data in a time division manner as the display data DT1 in a horizontal scanning period. In other words, the processing circuit 10 outputs the first to fourth display data in a time series manner. Accordingly, first to fourth data voltages are output from the amplifier circuit AM1 as the data voltage VD1 in a time division manner. The first to fourth data voltages are voltages obtained by performing the D/A conversion for the first to fourth display data.

The data voltage output terminal TD1 is coupled to the data voltage input terminal TI1 of the electro-optical panel 200. The data voltage input terminal TI1 is coupled to the data lines DL1 to DL4 via the demultiplexer DML1. The data lines DL1 to DL4 are data lines arranged side-by-side in a horizontal scanning direction in the electro-optical panel 200. The pixels PX are coupled to each of the data lines. In the horizontal scanning period, the demultiplexer DML1 selects the first to fourth data lines DL1 to DL4 to couple to the data voltage input terminal TI1. That is, when the amplifier circuit AM1 is outputting a first data voltage, the demultiplexer DML1 couples the first data line DL1 to the data voltage input terminal TI1. Thus, the first data line DL1 is driven by the first data voltage. Similarly, the second to fourth data lines DL2 to DL4 are driven by the second to fourth data voltages, respectively. Note that, a drive order of the first to fourth data lines DL1 to DL4 in the horizontal scanning period is not limited to the above, and may be any order. As described above, the operational amplifier AM1 drives the data line of the electro-optical panel. In other words, the operational amplifier AM1 supplies the data voltage to the data line of the electro-optical panel. Here, for example, the operational amplifier AM1 drives the first to fourth data lines DL1 to DL4 via the demultiplexer DML1, but the operational amplifier AM1 may directly drive the first data line DL1.

The display driver 100 performs polarity inversion driving. The polarity inversion driving is, for example, frame inversion driving or line inversion driving. The frame inversion driving is a technique that inverts a polarity of a data voltage per one or more frames. The frame is a vertical scanning period. The line inversion driving is a driving technique that inverts a polarity of a data voltage per one or more scan lines. In a frame or line in positive polarity driving, the amplifier circuits AM1 to AMt output data voltages with a positive polarity that are higher than a common voltage. In a frame or line in negative polarity driving, the amplifier circuits AM1 to AMt output data voltages with a negative polarity that are lower than the common voltage.

2. First Exemplary Embodiment

Figure 3:
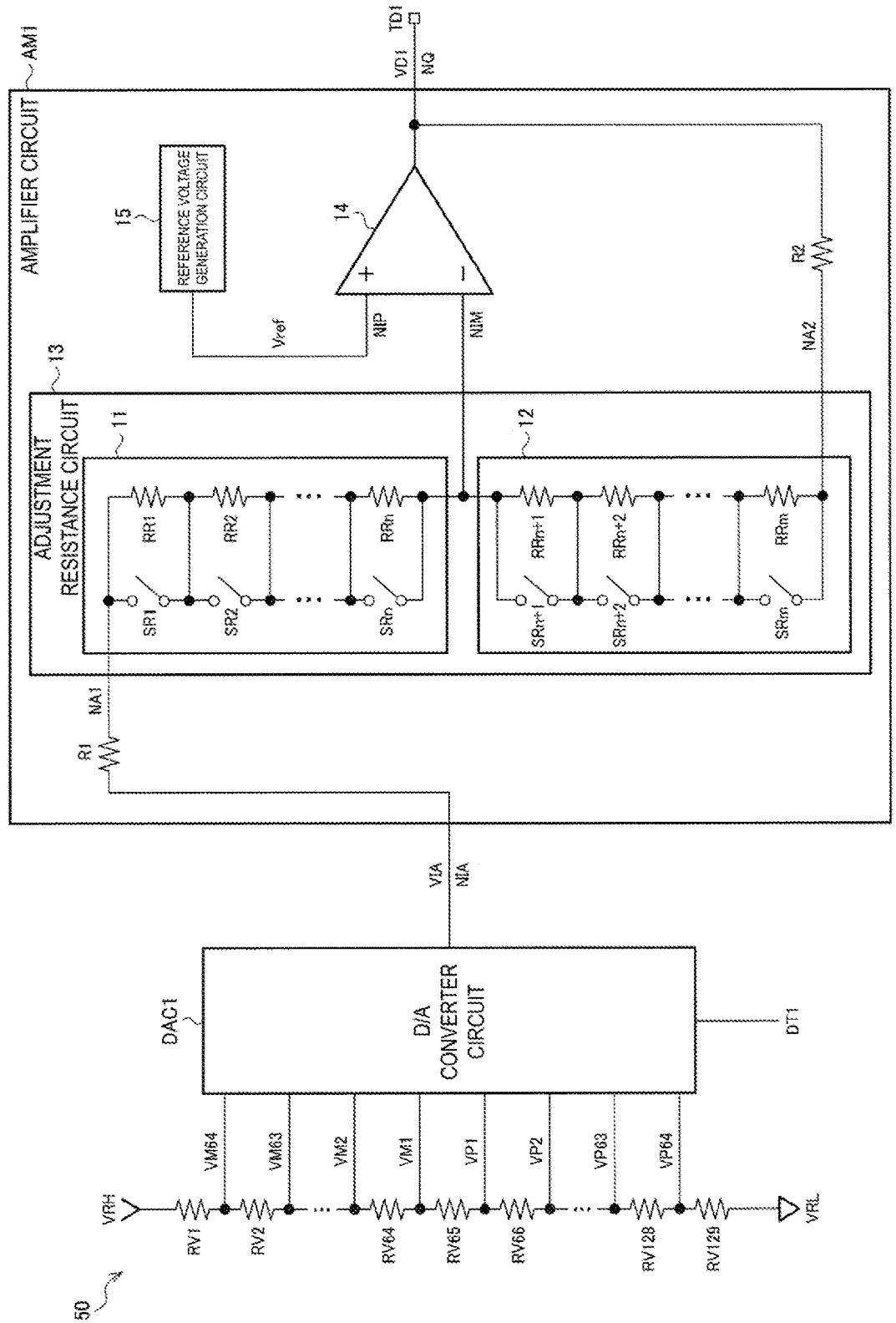
FIG. 3 illustrates an example configuration of an amplifier circuit according to a first exemplary embodiment.

FIG. 3 is a configuration example of the amplifier circuit AM1 according to a first exemplary embodiment. FIG. 3 also illustrates a detailed configuration example of the gradation voltage generation circuit 50. The amplifier circuit AM1 will be described below as an example, but the amplifier circuits AM2 to AMt also have a similar configuration. Further, a case where the display data DT1 is configured with 7 bits will be described below as an example, but the number of bits of the display data is arbitrary.

The gradation voltage generation circuit 50 is a ladder resistance circuit. Specifically, resistive elements RV1 to RV129 coupled in series between a node at a power supply voltage VRH and a node at a power supply voltage VRL are included. The power supply voltage VRH is higher than the power supply voltage VRL. Voltages VP1 to VP64 and VM1 to VM64 are output from taps of gradation voltage generation circuit 50. The tap is a node between the resistive elements. For example, the resistive elements RV2 to RV128 have an identical resistance value. Alternatively, the resistive elements RV2 to RV65 may have a resistance value corresponding to a gamma characteristic in the negative polarity driving, and the resistive elements RV66 to RV128 may have a resistance value corresponding to a gamma characteristic in the positive polarity driving.

The D/A converter circuit DAC1 selects a voltage corresponding to the display data DT1 from the plurality of voltages VP1 to VP64 and VM1 to VM64, and outputs the selected voltage as a gradation voltage VIA to an input node NIA of the amplifier circuit AM1. Specifically, when DT1=0000000, 0000001, . . . , or 0111111, the voltage VM64, VM63, . . . , or VM1 for the negative polarity driving is output as the gradation voltage VIA, respectively. When DT1=1000000, 1000001, . . . , or 1111111, the voltage VP1, VP2, . . . , or VP64 for the positive polarity driving is output as the gradation voltage VIA, respectively. Note that, DT1 is expressed as a binary number herein. In the polarity inversion driving, the positive polarity driving voltages VP1 to VP64 are selected for the positive polarity driving, and the negative polarity driving voltages VM1 to VM64 are selected for the negative polarity driving.

The amplifier circuit AM1 outputs the data voltage VD1 to an output node NQ by inverting and amplifying the gradation voltage VIA input to the input node NIA. The data voltage VD1 is output to the data voltage input terminal TI1 of the electro-optical panel 200 via the data voltage output terminal TD1. Accordingly, the data lines of the electro-optical panel 200 are driven. The amplifier circuit AM1 inverts and amplifies the gradation voltage VIA with a reference voltage Vref as a reference. The reference voltage Vref is essentially equal to the common voltage, but is adjusted by calibration described below. The common voltage is a voltage supplied to a common electrode of the electro-optical panel 200. Here, when the common voltage is VC, Vref=VC=VP1. At this time, the negative polarity driving voltages VM1 to VM64 input to the input node NIA are turned to data voltages with a negative polarity lower than the common voltage by the inverting amplification. Additionally, the positive polarity driving voltages VP1 to VP64 input to the input node NIA are turned to data voltages with a positive polarity higher than the common voltage by the inverting amplification.

The amplifier circuit AM1 includes an adjustment resistance circuit 13, an operational amplifier 14, a reference voltage generation circuit 15, resistance R1 that is a first resistance, and resistance R2 that is a second resistance.

The reference voltage Vref is input to a non-inverting input node NIP of the operational amplifier 14. The resistance R1 is provided between the input node NIA, and a node NA1 that is a first node. That is, one end of the resistance R1 is coupled to the input node NIA, and another end of the resistance R1 is coupled to the node NA1. The resistance R2 is provided between a node NA2 that is a second node, and the output node NQ of the operational amplifier 14. In other words, one end of the resistance R2 is coupled to the node NA2, and another end of the resistance R2 is coupled to the output node NQ. Note that, the coupling refers to coupling by which an electrical signal can be communicated. Coupling that allows communication of information by an electrical signal is electrical coupling, and may be, for example, coupling via a signal line or a passive element or the like.

The adjustment resistance circuit 13 adjusts a first adjustment resistance value and a second adjustment resistance value. The first adjustment resistance value is a resistance value for adjusting input resistance of an inverting amplifier circuit. The second adjustment resistance value is a resistance value for adjusting feedback resistance of the inverting amplifier circuit. Specifically, the adjustment resistance circuit 13 is coupled to the node NA1 and the node NA2, and to an inverting input node NIM of the operational amplifier 14. The first adjustment resistance value is a resistance value between the node NA1 and the inverting input node NIM of the operational amplifier 14. The second adjustment resistance value is a resistance value between the node NA2 and the inverting input node NIM of the operational amplifier 14.

The amplifier circuit AM1 is an inverting amplifier circuit, and an input resistance value of this inverting amplifier circuit is obtained by adding a resistance value of the resistance R1 and the first adjustment resistance value. Further, a feedback resistance value of the inverting amplifier circuit is obtained by adding a resistance value of the resistance R2 and the second adjustment resistance value. A gain of the inverting amplifier circuit is determined by a ratio of the input resistance value to the feedback resistance value. According to the present exemplary embodiment, by the adjustment resistance circuit 13 adjusting the first adjustment resistance value and the second adjustment resistance value, the input resistance and the feedback resistance value of the inverting amplifier circuit can be adjusted. In this way, the gain of the inverting amplifier circuit can be adjusted. For example, it is assumed that when an ideal value of R2/R1 is 1, R2/R1≠1 actually holds due to process variation. When the first adjustment resistance value is $\Delta r1$ and the second adjustment resistance value is $\Delta r2$, $\Delta r1$ and the $\Delta r2$ are set so that $(R2+\Delta r2)/(R1+\Delta r1)=1$. This adjusts the gain of the inverting amplifier circuit to −1.

The adjustment resistance circuit 13 is provided for each amplifier circuit. In other words, by the adjustment resistance circuit 13 of each amplifier circuit adjusting gain, gain variation among the amplifier circuits can be reduced. Accordingly, variation in data voltage among the amplifier circuits is reduced, so image quality is improved. For example, a data voltage error due to the gain variation increases with higher gradation. Thus, it is conceivable that an effect of the gain variation increases with higher gradation. According to the present exemplary embodiment, the gain variation among the amplifier circuits can be reduced and, thus, image quality is improved particularly with high gradation.

As illustrated in FIG. 3, the adjustment resistance circuit 13 includes a resistance circuit 11 that is a first resistance circuit, and a resistance circuit 12 that is a second resistance circuit. The resistance circuit 11 is provided between the node NA1 and the inverting input node NIM of the operational amplifier 14 to variably set the first adjustment resistance value. That is, the resistance circuit 11 is a variable resistance circuit. One end of the resistance circuit 11 is coupled to the node NA1 and another end is coupled to the inverting input node NIM. The resistance circuit 12 is provided between the node NA2 and the inverting input node NIM of the operational amplifier 14 to variably set the second adjustment resistance value. That is, the resistance circuit 12 is a variable resistance circuit. One end of the resistance circuit 12 is coupled to the node NA2 and another end is coupled to the inverting input node NIM.

Specifically, the resistance circuit 11 includes resistive elements RR1 to RRn, that are first to n-th resistive elements respectively, and switch elements SR1 to SRn, that are first to n-th switch elements respectively. n is an integer equal to or greater than 2. The resistive elements RR1 to RRn are coupled in series between the node NA1 and the inverting input node NIM of the operational amplifier 14. A switch element SRi is provided in parallel with a resistive element RRi. That is, one end of the switch element SRi is coupled to one end of the resistive element RRi, and another end of the switch element SRi is coupled to another end of the resistive element RRi. i is an integer from 1 to n. The switch elements SRi to SRn are, for example, transistors.

The resistance circuit 12 includes resistive elements RRn+1 to RRm that are n+1-th to m-th resistive elements respectively, and switch elements SRn+1 to SRm that are n+1-th to m-th switch elements respectively. m is an integer equal to or greater than n+2. For example, m=2n. The resistive elements RRn+1 to RRm are coupled in series between the node NA2 and the inverting input node NIM of the operational amplifier 14. A switch element SRj is provided in parallel with a resistive element RRj. That is, one end of the switch element SRj is coupled to one end of the resistive element RRj, and another end of the switch element SRj is coupled to another end of the resistive element RRj. j is an integer from n+1 to m. The switch elements SRn+1 to SRm are, for example, transistors.

The gain adjustment data RSD1 described in FIG. 1 is data that controls on or off of each of the switch elements SR1 to SRm. For example, when the switch element SR1 is on, both ends of the resistive element RR1 are short-circuited by the switch element SR1. That is, the first adjustment resistance value is lower compared to a case where the switch element SR1 is off. The same applies to the switch elements SR2 to SRn. In this way, the first adjustment resistance value is variably set. Similarly, when the switch element SRn+1 is on, the second adjustment resistance value is lower compared to a case where the switch element SRn+1 is off. The same applies to the switch elements SRn+2 to SRm. In this way, the second adjustment resistance value is variably set.

When parasitic resistance and parasitic capacitance occur in the inverting input node NIM that is a summing node of the inverting amplifier circuit, frequency response characteristics of the inverting amplifier circuit lower. In this regard, in the first exemplary embodiment, among the switch elements SR1 to SRn, SRn+1 to SRm that adjust resistance values, switch elements directly coupled to the inverting input node NIM are only SRn and SRn+1. Accordingly, an effect on the frequency response characteristics caused by provision of the adjustment resistance circuit 13 is small in this configuration.

3. Second Exemplary Embodiment

Figure 4:
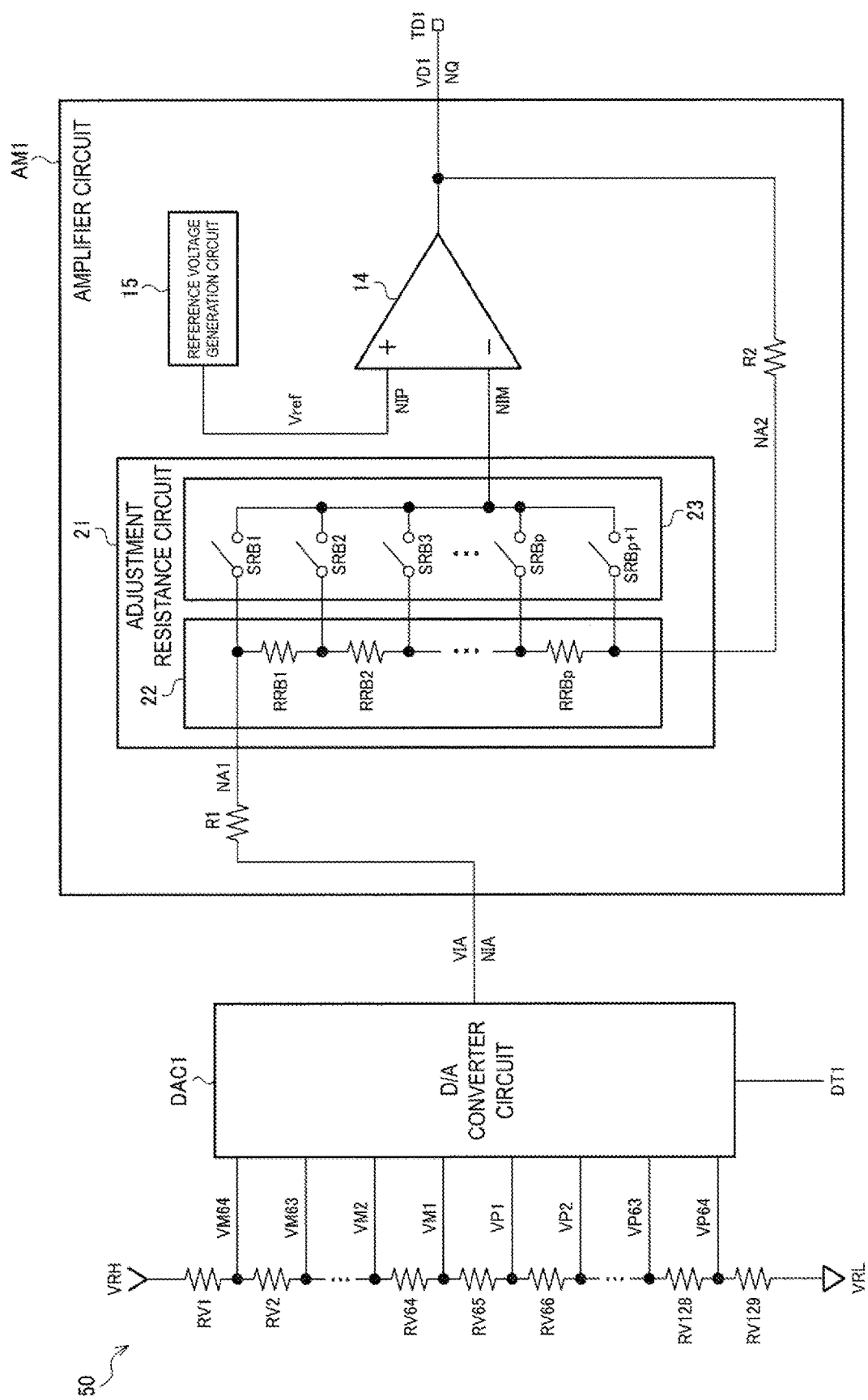
FIG. 4 illustrates an example configuration of an amplifier circuit according to a second exemplary embodiment.

FIG. 4 is a configuration example of the amplifier circuit AM1 according to a second exemplary embodiment. The amplifier circuit AM1 will be described below as an example, but the amplifier circuits AM2 to AMt also have a similar configuration. Note that the components that are the same as the components described above are referenced using like numbers, and no descriptions for such components are provided below.

The amplifier circuit AM1 includes an adjustment resistance circuit 21, the operational amplifier 14, the reference voltage generation circuit 15, the resistance R1 that is a first resistance, and the resistance R2 that is a second resistance. The adjustment resistance circuit 21 includes a ladder resistance circuit 22 and a selector 23.

The ladder resistance circuit 22 is provided between the node NA1, that is a first node, and the node NA2, that is a second node. Specifically, the ladder resistance circuit 22 includes resistive elements RRB1 to RRBp that are first to p-th resistive elements respectively. p is an integer equal to or greater than 2. The resistive elements RRB1 to RRBp are coupled in series between the node NA1 and the node NA2.

The selector 23 couples one of a plurality of taps of the ladder resistance circuit 22 to the inverting input node NIM of the operational amplifier 14. The tap is a node between the resistive elements. Specifically, the selector 23 includes switch elements SRB1 to SRBp+1 that are first to p+1-th switch elements respectively. One end of the switch element SRB1 is coupled to one end of the resistive element RRB1. Similarly, one ends of the switch elements SRB2 to SRBp are coupled to one ends of the resistive elements RRB2 to RRBp respectively. One end of the switch element SRBp+1 is coupled to another end of the resistive element RRBp. Another ends of the switch elements SRB1 to SRBp+1 are commonly coupled to the inverting input node NIM of the operational amplifier 14. The switch elements SRB1 to SRBp+1 are, for example, transistors.

The gain adjustment data RSD1 illustrated in FIG. 1 is data that turns on one of the switch elements SRB1 to SRBp+1 and turns off rest of the switch elements. A first adjustment resistance value is $\Delta r1$, and a second adjustment resistance value is $\Delta r2$. Further, on resistance of a switch element is assumed to be zero. For example, when the switch element SRB1 is on, $\Delta r1=0$ and $\Delta r2=RRB1+RRB2+ \ldots +RRBp$. When the switch element SRB2 is on, $\Delta r1=RRB1$ and $\Delta r2=RRB2+RRB3+ \ldots +RRBp$. In this way, depending on any of the switch elements that is on, the first adjustment resistance value and the second adjustment resistance value are variably set.

According to the present exemplary embodiment, by the adjustment resistance circuit 21 adjusting the first adjustment resistance value and the second adjustment resistance value, input resistance and a feedback resistance value of an inverting amplifier circuit can be adjusted. In this way, a gain of the inverting amplifier circuit can be adjusted. In addition, in each of the plurality of amplifier circuits, the adjustment resistance circuit 13 can adjust gain to reduce gain variation among the amplifier circuits.

4. Third Exemplary Embodiment

Figure 5:
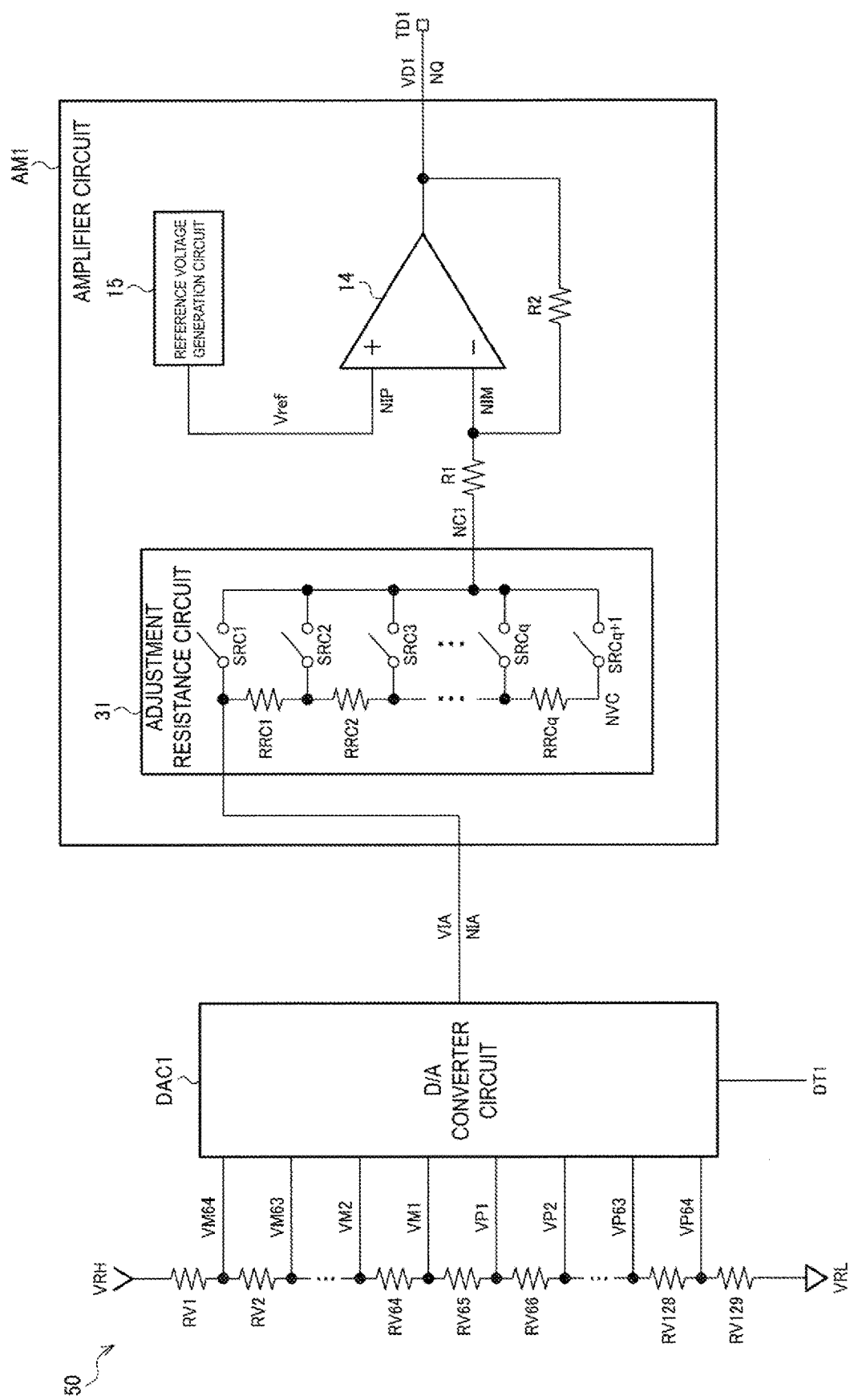
FIG. 5 illustrates an example configuration of an amplifier circuit according to a third exemplary embodiment.

FIG. 5 is a configuration example of the amplifier circuit AM1 according to a third exemplary embodiment. The amplifier circuit AM1 will be described below as an example, but the amplifier circuits AM2 to AMt also have a similar configuration. Note that the components that are the same as the components described above are referenced using like numbers, and no descriptions for such components are provided below.

The amplifier circuit AM1 includes an adjustment resistance circuit 31, the operational amplifier 14, the reference voltage generation circuit 15, the resistance R1 that is a first resistance, and the resistance R2 that is a second resistance.

The resistance R1, that is the first resistance, is provided between a node NC1 that is a first node and the inverting input node NIM of the operational amplifier 14. That is, one end of the resistance R1 is coupled to the node NC1, and another end of the resistance R1 is coupled to the inverting input node NIM. The resistance R2, that is the second resistance is provided between the inverting input node NIM of the operational amplifier 14, and the output node NQ of the operational amplifier 14. In other words, one end of the resistance R2 is coupled to the inverting input node NIM, and another end of the resistance R2 is coupled to the output node NQ.

The adjustment resistance circuit 31 is provided between the input node NIA and the node NC1. The adjustment resistance circuit 31 adjusts input resistance of the amplifier circuit AM1 by adjusting a resistance value between the input node NIA and the node NC1. Specifically, the adjustment resistance circuit 31 includes resistance elements RRC1 to RRCq that are first to q-th resistive elements respectively, and switch elements SRC1 to SRCq+1 that are first to q+1-th switch elements respectively. q is an integer equal to or greater than 2.

The resistive elements RRC1 to RRCq are coupled in series between the input node NIA and a node NVC. Each of the switch elements SRC1 to SRCq+1 couples one of taps of the resistive elements RRC1 to RRCq to the node NC1. The tap is a node between the resistive elements. Specifically, one end of the switch element SRC1 is coupled to one end of the resistive element RRC1. Similarly, one ends of the switch elements SRC2 to SRCq are coupled to one ends of the resistive elements RRC2 to RRCq respectively. One end of the switch element SRCq+1 is coupled to the node NVC. Another ends of the switch elements SRC1 to SRCq+1 are commonly coupled to the inverting input node NIM of the operational amplifier 14. The switch elements SRC1 to SRCq+1 are, for example, transistors.

The gain adjustment data RSD1 illustrated in FIG. 1 is data that turns on one of the switch elements SRC1 to SRCq+1 and turns off rest of the switch elements. A resistance value of the adjustment resistance circuit 31 is $\Delta r1$. Further, on resistance of a switch element is assumed to be zero. For example, when the switch element SRC1 is on, $\Delta r1=0$. When the switch element SRC2 is on, $\Delta r1=RRC1$. In this way, depending on any of the switch elements that is on, the resistance value of the adjustment resistance circuit 31 is variably set.

According to the present exemplary embodiment, by adjusting the resistance value of the adjustment resistance circuit 31, an input resistance value of an inverting amplifier circuit is adjusted. In this way, a gain of the inverting amplifier circuit can be adjusted. In addition, in each of the plurality of amplifier circuits, the adjustment resistance circuit 31 can adjust gain to reduce gain variation among the amplifier circuits.

5. Fourth Exemplary Embodiment

Figure 6:
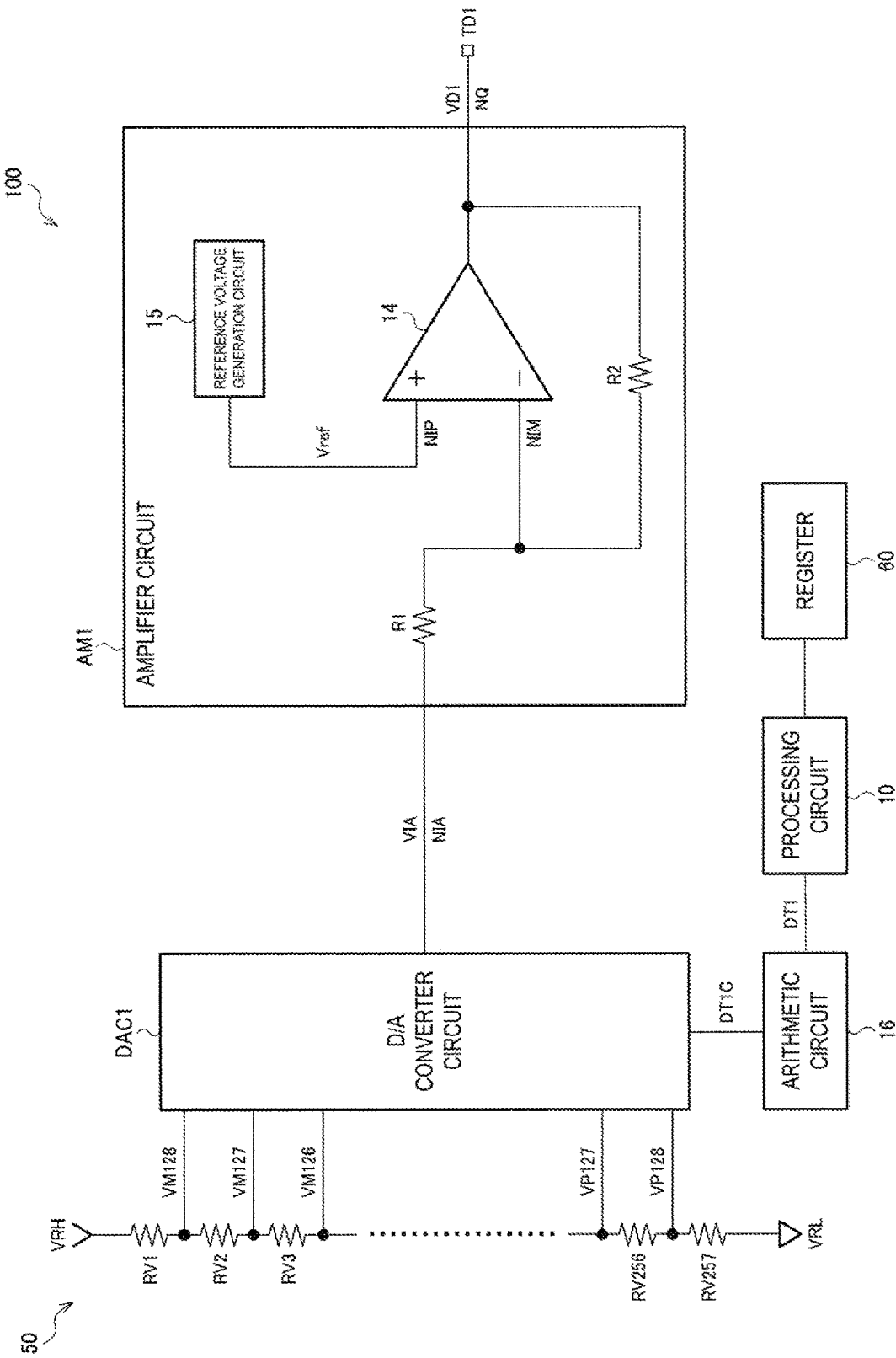
FIG. 6 illustrates an example configuration of a display driver and an amplifier circuit according to a fourth exemplary embodiment.

FIG. 6 illustrates a configuration example of the display driver 100 and the amplifier circuit AM1 according to a fourth exemplary embodiment. A configuration relating to the amplifier circuit AM1 will be described below as an example, but the amplifier circuits AM2 to AMt are also similarly configured. Note that the components that are the same as the components described above are referenced using like numbers, and no descriptions for such components are provided below.

In the fourth exemplary embodiment, the amplifier circuit AM1 includes the operational amplifier 14, the reference voltage generation circuit 15, the resistance R1 that is a first resistance, and the resistance R2 that is a second resistance. The resistance R1 is provided between the input node NIA and the inverting input node NIM of the operational amplifier 14. That is, one end of the resistance R1 is coupled to the input node NIA, and another end of the resistance R1 is coupled to the inverting input node NIM of the operational amplifier 14. The resistance R2 is provided between the inverting input node NIM of the operational amplifier 14 and the output node NQ of the operational amplifier 14. In other words, one end of the resistance R2 is coupled to the inverting input node NIM of the operational amplifier 14, and another end of the resistance R2 is coupled to the output node NQ of the operational amplifier 14. A gain of the amplifier circuit AM1 is $-R2/R1$.

Further, in the fourth exemplary embodiment, the display driver 100 further includes an arithmetic circuit 16 that performs arithmetic processing for the display data DT1. Note that, the arithmetic circuit 16 may be included in the processing circuit 10.

The display data DT1 is input to the arithmetic circuit 16 from the processing circuit 10. The arithmetic circuit 16 outputs output data DT1C by performing arithmetic processing that corrects a ratio of the resistance R1 to the resistance R2 for the display data DT1. The D/A converter circuit DAC1 converts the output data DT1C of the arithmetic circuit 16 to the gradation voltage VIA. For example, an ideal value of R2/R1 is rt, and actual R2/R1 with an error caused by process variation is $\Delta \times rt$. The arithmetic circuit 16 computes $DT1C=DT1\times(1/\Delta)$. Accordingly, the gradation voltage VIA output by the D/A converter circuit DAC1 is multiplied by $1/\Delta$, resulting in $VD1=-(\Delta \times rt)\times(VIA\times(1/\Delta))$ $=-rt\times VIA$. That is, a gain of an inverting amplifier circuit is substantially adjusted to the ideal value rt.

Specifically, the gradation voltage generation circuit 50 has the number of gradations that is, for example, twice the number of gradations of the display data DT1. That is, the gradation voltage generation circuit 50 includes resistive elements RV1 to RV257 coupled in series between a node at the power supply voltage VRH and a node at the power supply voltage VRL. From taps of the gradation voltage generation circuit 50, the voltages VM128 to VM1, VP1 to VP128 are output.

The number of bits in the display data DT1 is 7. At this time, the display data DT1 has 64 gradations for a positive polarity and 64 gradations for a negative polarity. The arithmetic circuit 16 outputs the output data DT1C of 8-bit by performing arithmetic processing for the display data DT1 of 7-bit. The output data DT1C has 128 gradations for the positive polarity and 128 gradations for the negative polarity.

The D/A converter circuit DAC1 selects a voltage corresponding to the output data DT1C from the voltages VM128 to VM1 and VP1 to VP128, and outputs the selected voltage as the gradation voltage VIA to the input node NIA of the amplifier circuit AM1. The voltages VM128 to VM1 are inverted and amplified by the amplifier circuit AM1 and turned to data voltages with a negative polarity. The voltages VP1 to VP128 are inverted and amplified by the amplifier circuit AM1, and turn to data voltages with a positive polarity.

As described above, the arithmetic circuit 16 calculates the output data DT1C by computing $DT1\times(1/\Delta)$. Since the number of gradations of the output data DT1C is twice that of the display data DT1, a data voltage error corresponding to the output data DT1C falls within 0.5 gradations. In this way, by performing the arithmetic processing that corrects the ratio of the resistance R1 to the resistance R2 for the display data DT1, it is possible to substantially adjust the gain of the inverting amplifier circuit.

6. Calibration Circuit

Figure 7:
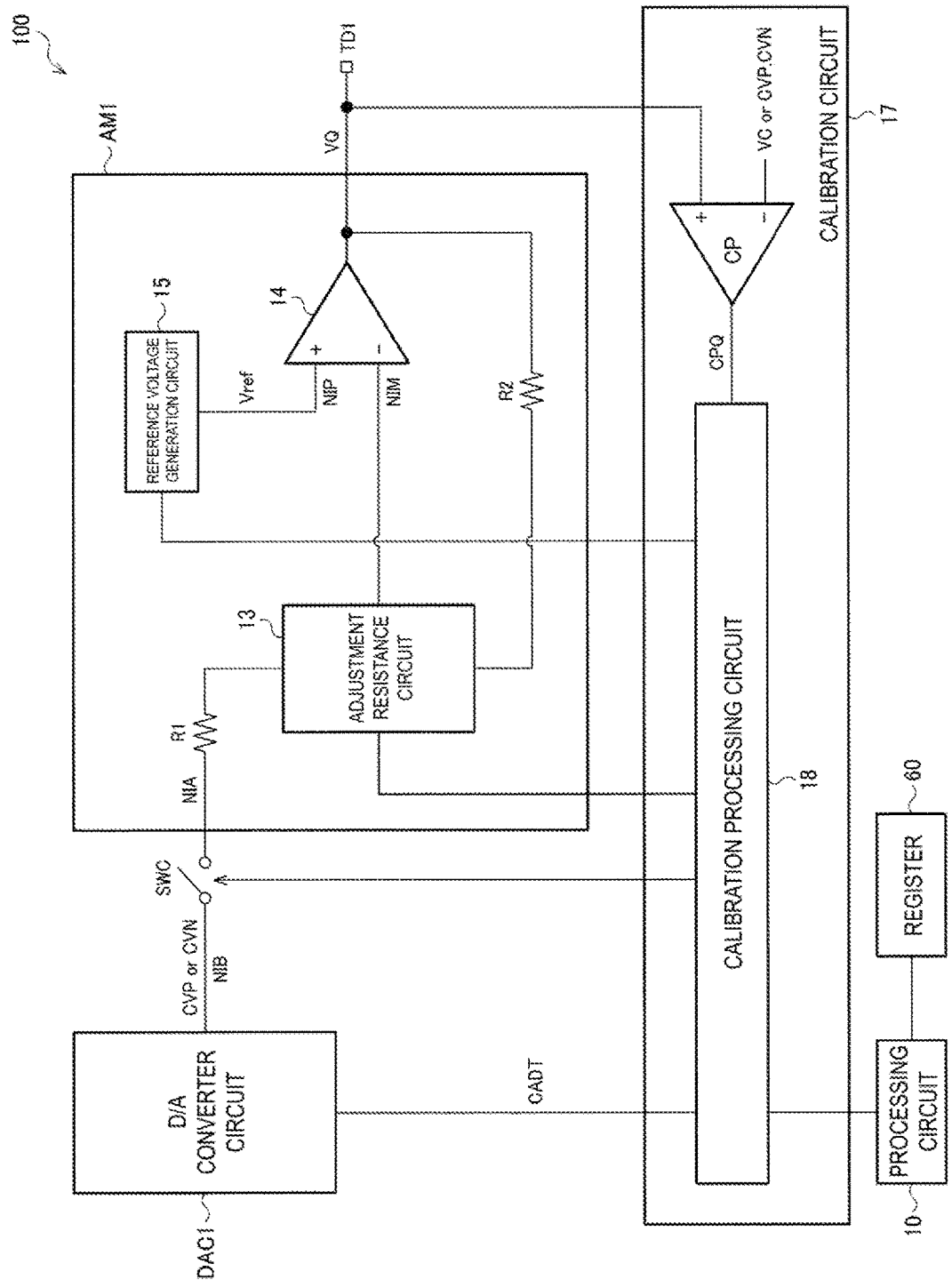
FIG. 7 illustrates an example configuration of a display driver and an amplifier circuit when calibration is performed.

FIG. 7 is a configuration example of the display driver 100 and the amplifier circuit AM1 when calibration is performed. A configuration relating to the amplifier circuit AM1 will be described below as an example, but the amplifier circuits AM2 to AMt are also similarly configured. In addition, in FIG. 7, the gradation voltage generation circuit 50 is not illustrated. Note that the components that are the same as the components described above are referenced using like numbers, and no descriptions for such components are provided below.

Here, a technique for performing calibration in the first exemplary embodiment will be described, but a similar calibration technique can be implemented in the second to fourth embodiments as described below.

In FIG. 7, the display driver 100 further includes a switch element SWC and a calibration circuit 17.

One end of the switch element SWC is coupled to an output node NIB of the D/A converter circuit DAC1, and another end of the switch element SWC is coupled to the input node NIA of the amplifier circuit AM1. The switch element SWC is a switch element for setting the input node NIA to a high impedance state in offset calibration to be described later. The switch element SWC is, for example, constituted by a transistor.

The calibration circuit 17 calibrates a first adjustment resistance value and a second adjustment resistance value of the amplifier circuit AM1 to perform gain calibration for the amplifier circuit AM1. The calibration circuit 17 performs the calibration during an initialization period after the display driver 100 is powered up, for example. Alternatively, the calibration circuit 17 may perform the calibration in a period in which the display driver 100 does not drive an electro-optical panel, such as a porch period between frames.

The calibration circuit 17 includes a comparator CP and a calibration processing circuit 18. The calibration processing circuit 18 may be included in the processing circuit 10.

The comparator CP compares an output voltage VQ of the amplifier circuit AM1 with a comparison voltage, and outputs a comparison result thereof as a signal CPQ. The comparison voltage is a common voltage VC or a calibration voltage CVP with a positive polarity, or a calibration voltage CVN with a negative polarity. The calibration processing circuit 18 calibrates the reference voltage Vref, the first adjustment resistance value, and the second adjustment resistance value based on the signal CPQ, and stores a result thereof in the register 60. When the amplifier circuit AM1 drives a pixel of an electro-optical panel, the reference voltage Vref, the first adjustment resistance value, and the second adjustment resistance value are set in accordance with a set value of the reference voltage Vref stored in the register 60, the first adjustment resistance value, and the second adjustment resistance value. One set of the comparator CP and the calibration processing circuit 18 may be provided for each of the amplifier circuits AM1 to AMt. Alternatively, a set of the comparator CP and the calibration processing circuit 18 may be provided in common for the amplifier circuits AM1 to AMt. In this case, the calibration circuit 17 performs the gain calibration for the amplifier circuits AM1 to AMt in a time division manner.

According to the present exemplary embodiment, by the calibration circuit 17 calibrating the first adjustment resistance value and the second adjustment resistance value, the gain of the amplifier circuit AM1 can be calibrated. This calibration is performed for each of the amplifier circuits AM1 to AMt. In other words, the amplifier circuits AM1 to AMt are calibrated so that gain variation is reduced.

A procedure of the calibration will be described in detail below. The calibration circuit 17 performs offset calibration, positive polarity gain calibration, and negative polarity gain calibration in this order. Note that, the order of the positive polarity gain calibration and the negative polarity gain calibration may be reversed.

Figure 8:
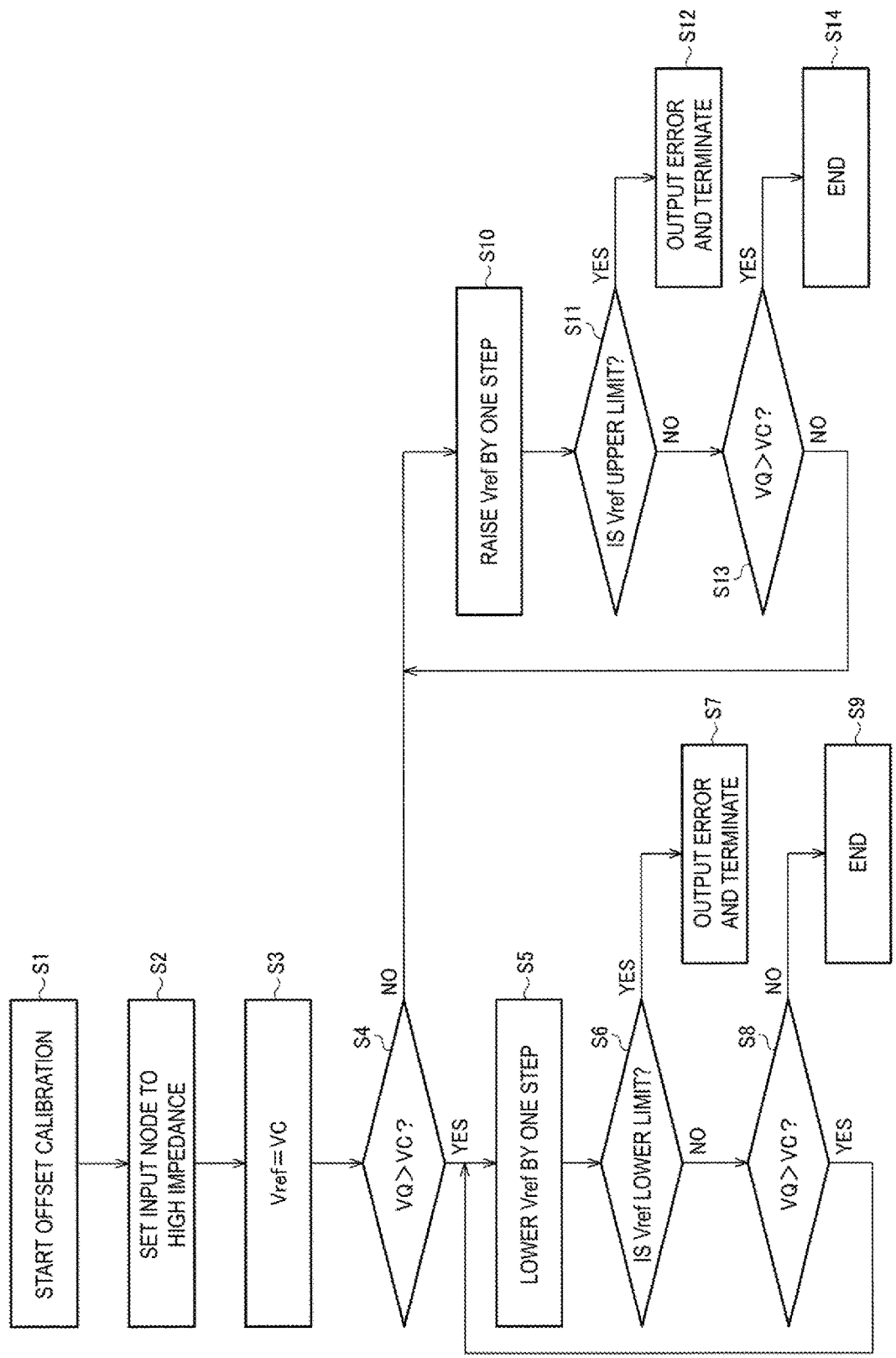
FIG. 8 is a flowchart illustrating a procedure of offset calibration.

FIG. 8 is a flowchart illustrating a procedure of the offset calibration. In step S1, the calibration processing circuit 18 initiates the offset calibration.

Next, in step S2, the calibration processing circuit 18 sets the input node NIA to high impedance. Specifically, the calibration processing circuit 18 turns the switch element SWC off. Accordingly, the amplifier circuit AM1 becomes a voltage follower circuit that buffers the reference voltage Vref.

Next, in step S3, the calibration processing circuit 18 causes the reference voltage generation circuit 15 to output the reference voltage Vref=VC. VC is the common voltage, that is, a center voltage of gradation.

Next, in step S4, the calibration processing circuit 18 determines whether VQ>VC or not, where VQ is the output voltage of the amplifier circuit AM1. In other words, the comparator CP compares VQ with VC. The comparator CP outputs the signal CPQ=H when VQ>VC, and outputs the signal CPQ=L when VQ<VC. H and L indicate a high level and a low level, respectively. The calibration processing circuit 18 determines whether VQ>VC or not based on the signal CPQ.

When determining VQ>VC in step S4, the calibration processing circuit 18 lowers the reference voltage Vref by one step in step S5. The reference voltage generation circuit 15 generates a plurality of voltages by, for example, resistance voltage dividing, or the like, and selects one of the voltages as the reference voltage Vref. The calibration processing circuit 18 causes the reference voltage generation circuit 15 to select a voltage below a currently selected voltage by one step as the reference voltage Vref.

Next, in step S6, the calibration processing circuit 18 determines whether the reference voltage Vref reaches a lower limit of a configurable range or not. When the reference voltage Vref reaches the lower limit, the calibration processing circuit 18 terminates the offset calibration after outputting an error in step S7. When the reference voltage Vref does not reach the lower limit, the calibration processing circuit 18 determines whether VQ>VC or not in step S8.

When determining VQ>VC in step S8, the calibration processing circuit 18 performs step S5 again. When determining not VQ>VC in step S8, the calibration processing circuit 18 terminates the offset calibration in step S9. At this time, the calibration processing circuit 18 stores the set value of the reference voltage Vref in the register 60.

When determining not VQ>VC in step S4, the calibration processing circuit 18 raises the reference voltage Vref by one step in step S10. That is, the calibration processing circuit 18 causes the reference voltage generation circuit 15 to select a voltage above a currently selected voltage by one step as the reference voltage Vref.

Next, in step S11, the calibration processing circuit 18 determines whether the reference voltage Vref reaches an upper limit of the configurable range or not. When the reference voltage Vref reaches the upper limit, the calibration processing circuit 18 terminates the offset calibration after outputting an error in step S12. When the reference voltage Vref does not reach the upper limit, the calibration processing circuit 18 determines whether VQ>VC or not in step S13.

When determining VQ>VC in step S13, the calibration processing circuit 18 terminates the offset calibration in step S14. At this time, the calibration processing circuit 18 stores the set value of the reference voltage Vref in the register 60. When determining not VQ>VC in step S13, the calibration processing circuit 18 performs step S10 again.

The above-described offset calibration is performed for each of the amplifier circuits. For example, when the calibration circuit 17 sequentially performs the offset calibration for the amplifier circuits AM1 to AMt, after the offset calibration is terminated in steps S7, S9, S12, or S14, the offset calibration is performed for the next amplifier circuit.

Figure 9:
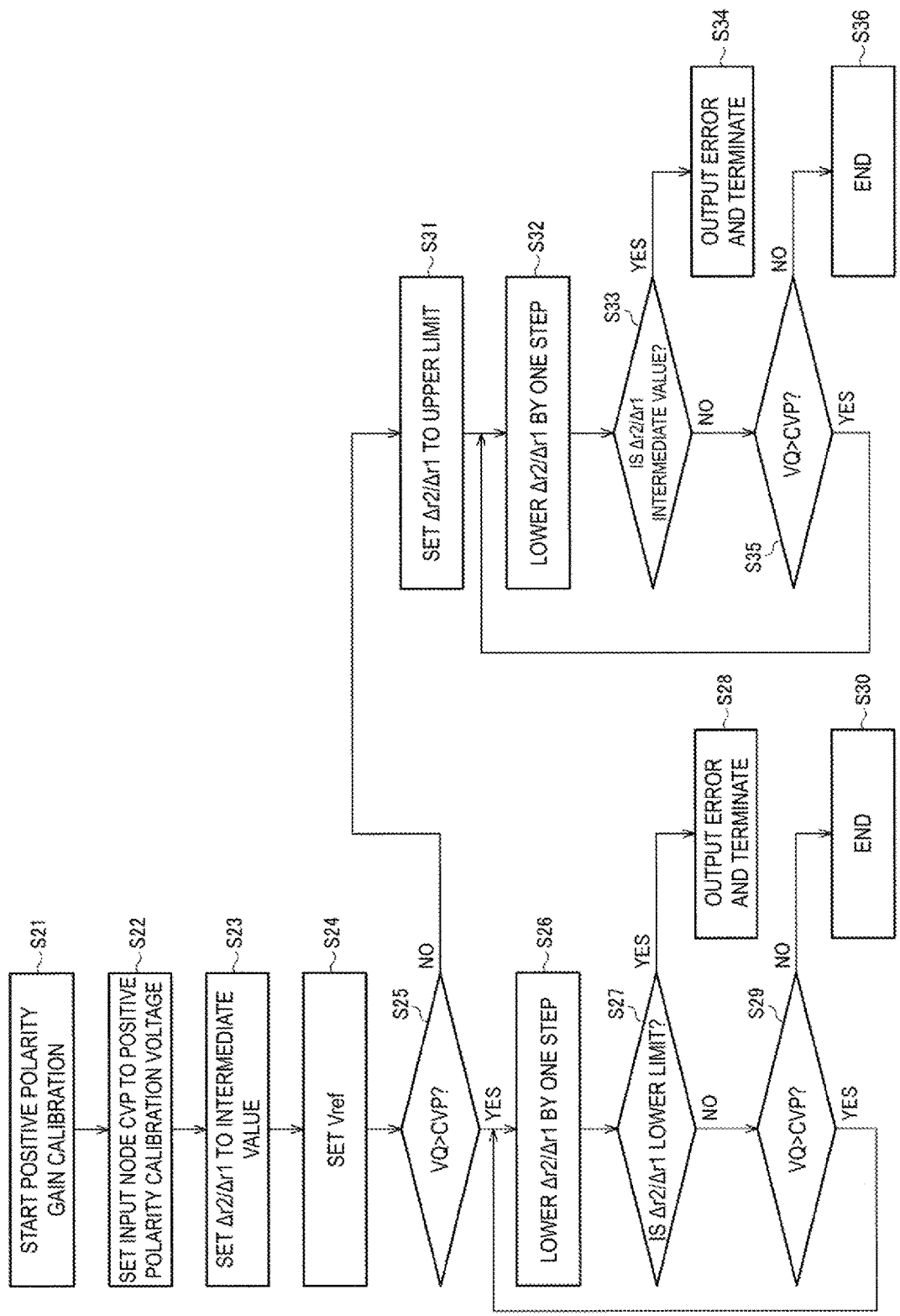
FIG. 9 is a flowchart illustrating a procedure of positive polarity gain calibration.

FIG. 9 is a flowchart illustrating a procedure of the positive polarity gain calibration. In step S21, the calibration processing circuit 18 initiates the positive polarity gain calibration.

Next, in step S22, the calibration processing circuit 18 sets the input node NIA to a calibration voltage CVP with a positive polarity. Specifically, the calibration processing circuit 18 turns the switch element SWC on. Further, the calibration processing circuit 18 outputs calibration data CADT with a positive polarity to the D/A converter circuit DAC1. The D/A Converter circuit DAC1 outputs the calibration voltage CVP by performing D/A conversion for CADT. The calibration voltage CVP is a central voltage, or VP64 that is a minimum voltage, among the voltages VP1 to VP64 described in FIG. 3.

Next, in step S23, the calibration processing circuit 18 sets Δr2/Δr1 to a median. For example, Δr1 and Δr2 are set to the median, to set Δr2/Δr1=1. Δr1 is a first adjustment resistance value, that is, a resistance value of the resistance circuit 11 in FIG. 3. Δr2 is a second adjustment resistance value, that is, a resistance value of the resistance circuit 12 in FIG. 3.

Next, in step S24, the calibration processing circuit 18 reads the set value of the reference voltage Vref determined in the offset calibration from the register 60, and sets the reference voltage Vref according to the set value.

Next, in step S25, the calibration processing circuit 18 determines whether VQ>CVP or not, where VQ is the output voltage of the amplifier circuit AM1. In other words, the comparator CP compares VQ with CVP. The comparator CP outputs the signal CPQ=H when VQ>CVP, and outputs the signal CPQ=L when VQ<CVP. The calibration processing circuit 18 determines whether VQ>CVP or not based on the signal CPQ.

When determining VQ>CVP in step S25, the calibration processing circuit 18 lowers Δr2/Δr1 by one step in step S26. In other words, the calibration processing circuit 18 causes the adjustment resistance circuit 13 to select a resistance value above a currently selected resistance value by one step as Δr1. Additionally, the calibration processing circuit 18 causes the adjustment resistance circuit 13 to select a resistance value below the currently selected resistance value by one step as Δr2.

Next, in step S27, the calibration processing circuit 18 determines whether Δr2/Δr1 reaches a lower limit of a configurable range or not. When Δr2/Δr1 reaches the lower limit, the calibration processing circuit 18 terminates the positive polarity gain calibration after outputting an error in step S28. When Δr2/Δr1 does not reach the lower limit, the calibration processing circuit 18 determines whether VQ>CVP or not in step S29.

When determining VQ>CVP in step S29, the calibration processing circuit 18 performs step S26 again. When determining not VQ>CVP in step S29, the calibration processing circuit 18 terminates the positive polarity gain calibration in step S30. At this time, the calibration processing circuit 18 stores respective set values of Δr1 and the Δr2 in the register 60.

When determining not VQ>CVP in step S25, the calibration processing circuit 18 sets Δr2/Δr1 to an upper limit of the configurable range in step S31.

Next, in step S32, the calibration processing circuit 18 lowers Δr2/Δr1 by one step. In other words, the calibration processing circuit 18 causes the adjustment resistance circuit 13 to select a resistance value above a currently selected resistance value by one step as Δr1. Additionally, the calibration processing circuit 18 causes the adjustment resistance circuit 13 to select a resistance value below the currently selected resistance value by one step as Δr2.

Next, in step S33, the calibration processing circuit 18 determines whether Δr2/Δr1 reaches an intermediate value or not. The intermediate value here is, for example, above the median in step S23 by one step. When Δr2/Δr1 reaches the intermediate value, the calibration processing circuit 18 terminates the positive polarity gain calibration after outputting an error in step S34. When Δr2/Δr1 does not reach the intermediate value, the calibration processing circuit 18 determines whether VQ>CVP or not in step S35.

When determining VQ>CVP in step S35, the calibration processing circuit 18 performs step S32 again. When determining not VQ>CVP in step S35, the calibration processing circuit 18 terminates the positive polarity gain calibration in step S36. At this time, the calibration processing circuit 18 stores respective set values of Δr1 and the Δr2 in the register 60.

Figure 10:
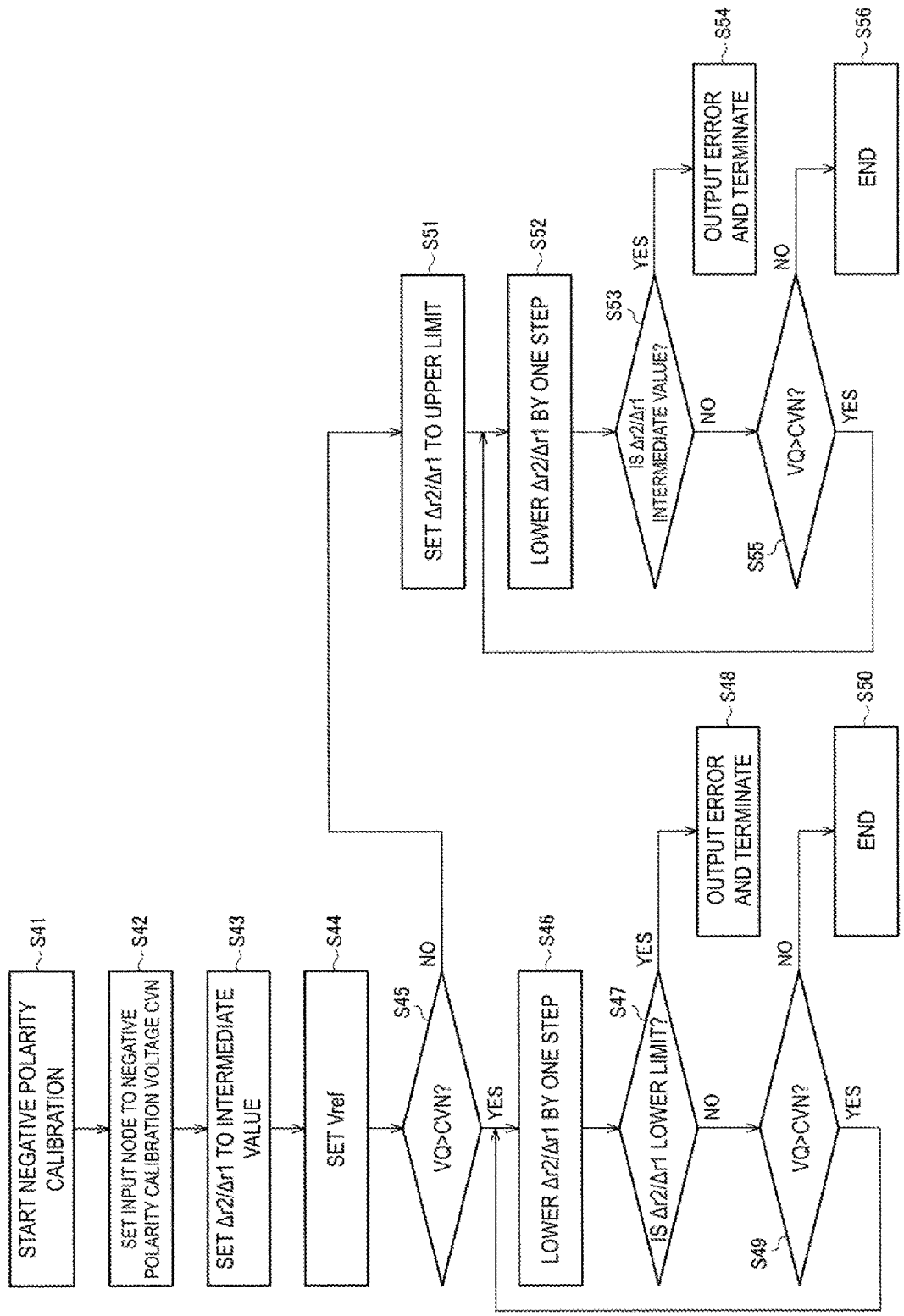
FIG. 10 is a flowchart illustrating a procedure of negative polarity gain calibration.

FIG. 10 is a flowchart illustrating a procedure of the negative polarity gain calibration. In step S41, the calibration processing circuit 18 initiates the negative polarity gain calibration.

Next, in step S42, the calibration processing circuit 18 sets the input node NIA to a calibration voltage CVN with a negative polarity. Specifically, the calibration processing circuit 18 turns the switch element SWC on. Additionally, the calibration processing circuit 18 outputs the calibration data CADT with a negative polarity to the D/A converter circuit DAC1. The D/A converter circuit DAC1 outputs the calibration voltage CVN by performing the D/A conversion for CADT. The calibration voltage CVN is a central voltage, or VM64 that is a maximum voltage, among the voltages VM1 to VM64 described in FIG. 3.

Next, in step S43, the calibration processing circuit 18 sets Δr2/Δr1 to a median. For example, Δr1 and Δr2 are set to the median, to set Δr2/Δr1=1.

Next, in step S44, the calibration processing circuit 18 reads the set value of the reference voltage Vref determined in the offset calibration from the register 60, and sets the reference voltage Vref according to the set value.

Next, in step S45, the calibration processing circuit 18 determines whether VQ<CVN or not, where VQ is the output voltage of the amplifier circuit AM1. In other words, the comparator CP compares VQ with CVN. The comparator CP outputs the signal CPQ=H when VQ>CVN and outputs the signal CPQ=L when VQ<CVN. The calibration processing circuit 18 determines whether VQ<CVN or not based on the signal CPQ.

When determining VQ<CVN in step S45, the calibration processing circuit 18 lowers Δr2/Δr1 by one step in step S46. In other words, the calibration processing circuit 18 causes the adjustment resistance circuit 13 to select a resistance value above a currently selected resistance value by one step as Δr1. Additionally, the calibration processing circuit 18 causes the adjustment resistance circuit 13 to select a resistance value below the currently selected resistance value by one step as Δr2.

Next, in step S47, the calibration processing circuit 18 determines whether Δr2/Δr1 reaches a lower limit of a configurable range or not. When Δr2/Δr1 reaches the lower limit, the calibration processing circuit 18 terminates the negative polarity gain calibration after outputting an error in step S48. When Δr2/Δr1 does not reach the lower limit, the calibration processing circuit 18 determines whether VQ<CVN or not in step S49.

When determining VQ<CVN in step S49, the calibration processing circuit 18 performs step S46 again. When determining not VQ<CVN in step S49, the calibration processing circuit 18 terminates the negative polarity gain calibration in step S50. At this time, the calibration processing circuit 18 stores respective set values of Δr1 and the Δr2 in the register 60.

When determining not VQ<CVN in step S45, the calibration processing circuit 18 sets Δr2/Δr1 to an upper limit of the configurable range in step S51.

Next, in step S52, the calibration processing circuit 18 lowers Δr2/Δr1 by one step. In other words, the calibration processing circuit 18 causes the adjustment resistance circuit 13 to select a resistance value above a currently selected resistance value by one step as Δr1. Additionally, the calibration processing circuit 18 causes the adjustment resistance circuit 13 to select a resistance value below the currently selected resistance value by one step as Δr2.

Next, in step S53, the calibration processing circuit 18 determines whether Δr2/Δr1 reaches an intermediate value or not. The intermediate value here is, for example, above the median in step S43 by one step. When Δr2/Δr1 reaches the intermediate value, the calibration processing circuit 18 terminates the negative polarity gain calibration after outputting an error in step S54. When Δr2/Δr1 does not reach the intermediate value, the calibration processing circuit 18 determines whether VQ<CVN or not in step S55.

When determining VQ<CVN in step S55, the calibration processing circuit 18 performs step S52 again. When determining not VQ<CVN in step S55, the calibration processing circuit 18 terminates the negative polarity gain calibration in step S56. At this time, the calibration processing circuit 18 stores respective set values of Δr1 and the Δr2 in the register 60.

As described above, the calibration circuit 17 adjusts the reference voltage Vref input to the non-inverting input node NIP of the operational amplifier 14 so that an output of the amplifier circuit AM1 equals the center voltage of the gradation, to perform the offset calibration for the amplifier circuit AM1. Then, the calibration circuit 17 adjusts the first adjustment resistance value Δr1 and the second adjustment resistance value Δr2, in a state where a predetermined voltage is input to the input node NIA, to perform the gain calibration for the amplifier circuit AM1. The center voltage is the common voltage VC. Additionally, the predetermined voltage is the calibration voltage CVP or CVN.

In this way, after an offset of the amplifier circuit AM1 is calibrated, the gain of the amplifier circuit AM1 can be calibrated. Accordingly, the gain of the amplifier circuit AM1 is accurately calibrated. Similarly, respective gains of the amplifier circuits AM2 to AMt are accurately calibrated. Accordingly, gain variation among the plurality of amplifier circuits is accurately calibrated.

Further, in the present exemplary embodiment, the calibration circuit 17 adjusts the reference voltage Vref so that the output of the amplifier circuit AM1 equals the center voltage in a state where the input node NIA is set to high impedance, to perform the offset calibration.

In this way, by setting the input node NIA to the high impedance, the amplifier circuit AM1 is configured as a voltage follower circuit. At this time, the output of the amplifier circuit AM1 is a voltage obtained by adding an offset voltage to the reference voltage Vref. By adjusting the reference voltage Vref so that the output of the amplifier circuit AM1 equals the center voltage, the offset of the amplifier circuit AM1 is canceled.

Additionally, in the present exemplary embodiment, the calibration circuit 17 performs the positive polarity gain calibration that determines the first adjustment resistance value Δr1 and the second adjustment resistance value Δr2 for positive polarity driving, and the negative polarity gain calibration that determines the first adjustment resistance value Δr1 and the second adjustment resistance value Δr2 for negative polarity driving.

In this way, gain in the positive polarity driving and gain in the negative polarity driving are each accurately calibrated. Depending on characteristics of the operational amplifier 14, the resistance R1 and R2, gain errors may be different between the positive polarity driving and the negative polarity driving, but in the present exemplary embodiment, the gain errors are each accurately calibrated.

Additionally, as illustrated in FIG. 1, the display driver 100 includes the D/A converter circuit DAC2, that is a second D/A converter circuit, and the amplifier circuit AM2, that is a second amplifier circuit. The D/A converter circuit DAC2 converts the display data DT2, that is second display data, to a second gradation voltage. An input node of the amplifier circuit AM2 is a second input node. A second gradation voltage is input to the second input node, and the amplifier circuit AM2 outputs the data voltage VD2 that is a second data voltage.

The amplifier circuit AM2 is configured similarly to the amplifier circuit AM1 in FIG. 3. Specifically, the amplifier circuit AM2 includes a second operational amplifier, a third resistance, a fourth resistance, and a second adjustment resistance circuit. A non-inverting input node of the second operational amplifier is a second non-inverting input node. A second reference voltage is input to the second non-inverting input node. The third resistance is provided between the second input node and a third node. An output node of the second operational amplifier is a second output node. The fourth resistance is provided between a fourth node and the second output node. An inverting input node of the second operational amplifier is a second inverting input node. The second adjustment resistance circuit adjusts a third adjustment resistance value between the third node and the second inverting input node, and a fourth adjustment resistance value between the fourth node and the second inverting input node.

The calibration circuit 17 performs the gain calibration so that the amplifier circuit AM1 and the amplifier circuit AM2 have an identical gain. In other words, the first to fourth adjustment resistance values are determined so that the amplifier circuit AM1 and the amplifier circuit AM2 have an identical gain.

In this way, even when the respective gains of the amplifier circuit AM1 and the amplifier circuit AM2 are different due to process variation, the gain calibration is performed to equalize the gains. Accordingly, an error between a data voltage output by the amplifier circuit AM1 and a data voltage output by the amplifier circuit AM2 is reduced.

Note that, here, the gain calibration between the amplifier circuits AM1 and AM2 has been described as an example, but the calibration circuit 17 performs the gain calibration so that arbitrary two number of the amplifier circuits among the amplifier circuits AM1 to AMt have an identical gain. More specifically, the calibration circuit 17 performs the gain calibration so that the amplifier circuits AM1 to AMt have an identical gain.

Although the case where the calibration is applied to the first exemplary embodiment has been described above, a similar calibration technique can be applied to the second to fourth embodiments. Hereinafter, differences from the case where the calibration is applied to the first exemplary embodiment will be mainly described.

When the calibration technique is applied to the second exemplary embodiment, the calibration circuit 17 performs the gain calibration by adjusting the first adjustment resistance value Δr1 and the second adjustment resistance value Δr2 of the adjustment resistance circuit 21 illustrated in FIG. 4.

That is, in steps S26, S32 in FIG. 9 and steps S46, S52 in FIG. 10, the calibration circuit 17 selects a next switch element, to lower Δr2/Δr1 by one step. When SRB2 is selected from the switch elements SRB1 to SRBp+1, for example, the calibration circuit 17 causes the adjustment resistance circuit 21 to select SRB3. Accordingly, Δr1 increases from RRB1 to RRB1+RRB2 and Δr2 decreases from RRB2+ . . . +RRBp+1 to RRB3+ . . . +RRBp+1. That is, Δr2/Δr1 decreases.

When the calibration technique is applied to the third exemplary embodiment, the calibration circuit 17 performs the gain calibration by adjusting the resistance value of the adjustment resistance circuit 31 illustrated in FIG. 5.

That is, in step S23 in FIG. 9 and step S43 in FIG. 10, the calibration circuit 17 sets the resistance value of the adjustment resistance circuit 31 to the median. Also in S31 in FIG. 9 and S51 in FIG. 10, the calibration circuit 17 sets the resistance value of the adjustment resistance circuit 31 to the lower limit of the configurable range. Also in steps S26, S32 in FIG. 9 and steps S46, S52 in FIG. 10, the calibration circuit 17 selects a next switch element to raise the resistance value of the adjustment resistance circuit 31 by one step. When SRC2 is selected from the switch elements SRC1 to SRCq+1, for example, the calibration circuit 17 causes the adjustment resistance circuit 31 to select SRC3. Accordingly, the resistance value of the adjustment resistance circuit 31 increases from RRC1 to RRC1+RRC2.

When the calibration technique is applied to the fourth exemplary embodiment, the calibration circuit 17 determines the arithmetic processing performed by the arithmetic circuit 16 illustrated in FIG. 6, to perform the gain calibration for the amplifier circuit AM1. At this time, the calibration circuit 17 determines the arithmetic processing so that the ratio of the resistor R1 to the resistor R2 is calibrated.

As described above, the arithmetic circuit 16 computes DT1C=DT1×(1/Δ), where actual R2/R1 is Δ×rt when an error due to the process variation occurs. In other words, 1/Δ is determined to determine the arithmetic processing. In step S23 in FIG. 9 and step S43 in FIG. 10, the calibration circuit 17 sets 1/Δ to the median. For example, 1/Δ=1 is set. Also in S31 in FIG. 9 and S51 in FIG. 10, the calibration circuit 17 sets 1/Δ to the upper limit of the configurable range. Also in steps S26, S32 in FIG. 9 and steps S46, S52 in FIG. 10, the calibration circuit 17 lowers 1/Δ by one step. For example, the arithmetic circuit 16 can set a plurality of discrete values as 1/Δ. At this time, the calibration circuit 17 causes the arithmetic circuit 16 to select a value below a currently selected value by one step as 1/Δ.

7. Electro-Optical Device and Electronic Apparatus

Figure 11:
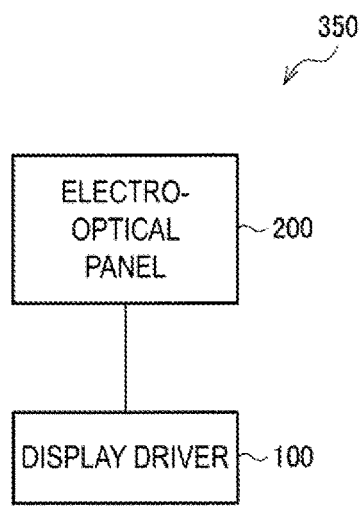
FIG. 11 illustrates an example configuration of an electro-optical device.

FIG. 11 illustrates an example of a configuration of an electro-optical device 350 including the display driver 100. The electro-optical device 350 includes the display driver 100 and the electro-optical panel 200.

The electro-optical panel 200 is, for example, an active matrix type liquid crystal display panel. For example, the display driver 100 is mounted on a flexible substrate, the flexible substrate is coupled to the electro-optical panel 200, and data voltage output terminals of the display driver 100 and data voltage input terminals of the electro-optical panel 200 are coupled via lines formed on the flexible substrate. Alternatively, the display driver 100 may be mounted on a rigid substrate, the rigid substrate and the electro-optical panel 200 may be coupled via a flexible substrate, and data voltage output terminals of the display driver 100 and data voltage input terminals of the electro-optical panel 200 may be coupled via lines formed on the rigid substrate and the flexible substrate.

Figure 12:
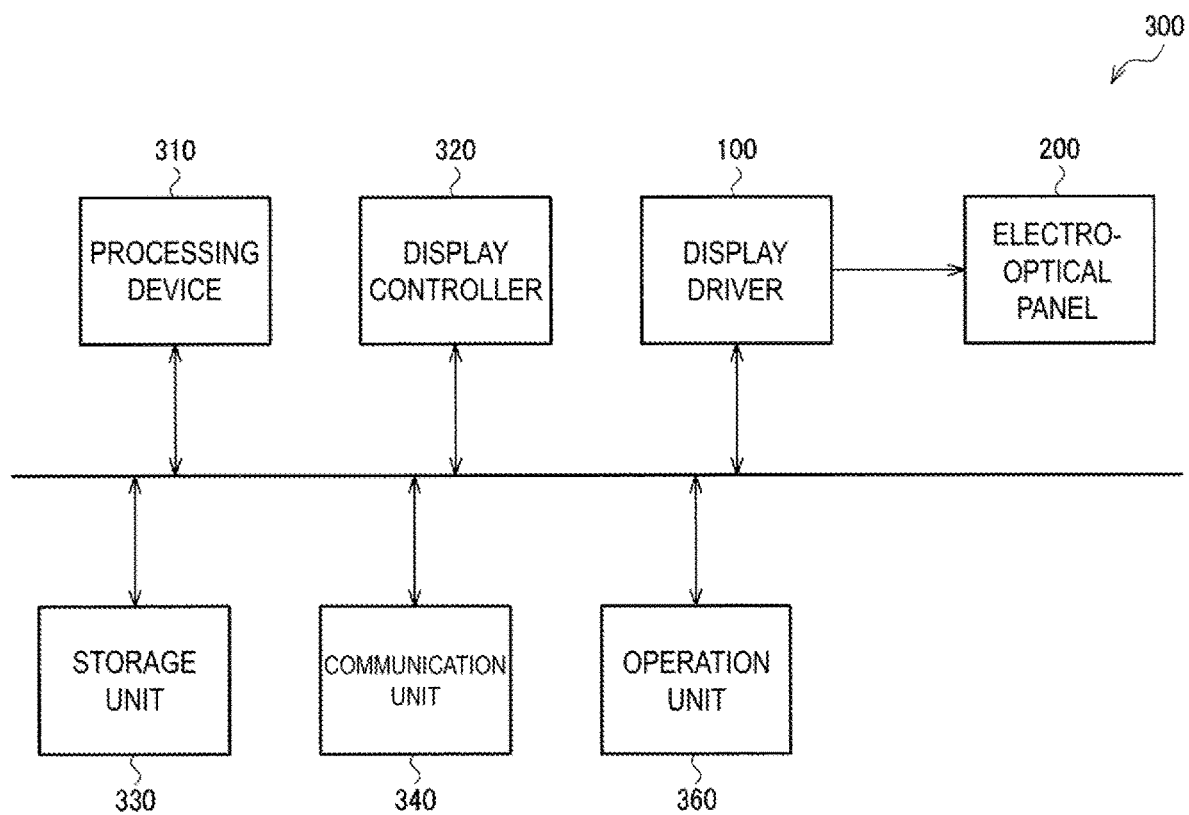
FIG. 12 illustrates an example configuration of an electronic apparatus.

FIG. 12 illustrates an example of a configuration of an electronic apparatus 300 including the display driver 100. The electronic apparatus 300 includes a processing device 310, a display controller 320, the display driver 100, the electro-optical panel 200, a storage unit 330, a communication unit 340, and an operation unit 360. The storage unit 330 is also called a storage device or memory. The communication unit 340 is also called a communication circuit or a communication device. The operation unit 360 is also called an operation device. Specific examples of the electronic apparatus 300 may include various electronic apparatuses provided with display devices, such as a projector, a head-mounted display, a mobile information terminal, a vehicle-mounted device, a portable game terminal, and an information processing device. The vehicle-mounted device is, for example, a meter panel, a car navigation system, or the like.

The operating unit 360 is a user interface for various types of operations by a user. For example, the operating unit 360 is a button, a mouse, a keyboard, and/or a touch panel mounted on the electro-optical panel 200. The communication unit 340 is a data interface used for inputting and outputting image data and control data. Examples of the communication unit 340 include a wireless communication interface, such as a wireless LAN interface or a near field communication interface, and a wired communication interface, such as wired LAN interface or a USB interface. The storage unit 330, for example, stores data input from the communication unit 340 or functions as a working memory for the processing device 310. The storage unit 330 is, for example, a memory, such as a RAM or a ROM, a magnetic storage device, such as an HDD, or an optical storage device, such as a CD drive or a DVD drive. The display controller 320 processes image data input from the communication unit 340 or stored in the storage unit 330, and transfers the processed image data to the display driver 100. The display driver 100 displays an image on the electro-optical panel 200 based on the image data transferred from the display controller 320. The processing device 310 carries out control processing for the electronic apparatus 300 and various types of signal processing. The processing device 310 is, for example, a processor, such as a CPU or an MPU, or an ASIC.

For example, in a case where the electronic apparatus 300 is a projector, the electronic apparatus 300 further includes a light source and an optical system. The optical system is, for example, a lens, a prism, a mirror, or the like. In the case where the electro-optical panel 200 is of a transmissive type, the optical device emits light from the light source to the electro-optical panel 200, and the light transmitted through the electro-optical panel 200 is projected on a screen. In the case where the electro-optical panel 200 is of a reflective type, the optical device emits light from the light source to the electro-optical panel 200, and the light reflected at the electro-optical panel 200 is projected on a screen.

The display driver described in the above-described exemplary embodiments includes the D/A converter circuit for converting the display data to the gradation voltage, and the amplifier circuit. The gradation voltage is input to the input node of the amplifier circuit, and the amplifier circuit outputs the data voltage. The amplifier circuit includes the operational amplifier, the first resistance, the second resistance, and the adjustment resistance circuit. The reference voltage is input to the non-inverting input node of the operational amplifier. The first resistance is provided between the input node and the first node. The second resistance is provided between the second node and the output node of the operational amplifier. The adjustment resistance circuit adjusts the first adjustment resistance value, that is the resistance value between the first node and the inverting input node of the operational amplifier, and the second adjustment resistance value, that is the resistance value between the second node and the inverting input node of the operational amplifier.

In this way, by the adjustment resistance circuit adjusting the first adjustment resistance value and the second adjustment resistance value, the input resistance and the feedback resistance value of the amplifier circuit serving as the inverting amplifier circuit can be adjusted. Accordingly, the gain of the amplifier circuit can be adjusted. Further, this gain adjustment is performed in each of the plurality of amplifier circuits, thereby reducing gain variation among the amplifier circuits.

In the present exemplary embodiment, the adjustment resistance circuit may include the first resistance circuit and the second resistance circuit. The first resistance circuit may be provided between the first node and the inverting input node of the operational amplifier, and the first adjustment resistance value may be variably set. The second resistance circuit may be provided between the second node and the inverting input node of the operational amplifier, and the second adjustment resistance value may be variably set.

In this way, the first adjustment resistance value, that is the resistance value of the first resistance circuit, and the second adjustment resistance value, that is the resistance value of the second resistance circuit, can be variably set. Accordingly, the first adjustment resistance value and the second adjustment resistance value can be adjusted so that the gain of the amplifier circuit can be adjusted.

Further, in the present exemplary embodiment, the first resistance circuit may include the first to n-th resistive elements (n is an integer of 2 or greater) and the first to n-th switch elements. The first to n-th resistive elements may be coupled in series between the first node and the inverting input node of the operational amplifier. An i-th switch element among the first to n-th switch elements (i is an integer from 1 to n) may be provided in parallel with an i-th resistive element among the first to n-th resistive elements. The second resistance circuit may have the n+1-th to m-th resistive elements (m is an integer equal to or greater than n+2), and the n+1-th to m-th switch elements. The n+1-th to m-th resistive elements may be coupled in series between the second node and the inverting input node of the operational amplifier. A j-th switch element among the n+1-th to m-th switch elements (j is an integer from n+1 to m) may be provided in parallel with a j-th resistive element among the n+1-th to m-th resistive elements.

In this way, the first adjustment resistance value, that is the resistance value of the first resistance circuit, is variably set, by controlling on or off of each of the first to n-th switch elements. Further, the second adjustment resistance value, that is the resistance value of the second resistance circuit, is variably set, by controlling on or off of each of the n+1-th to m-th switch elements.

Additionally, in the present exemplary embodiment, the adjustment resistance circuit may include the ladder resistance circuit provided between the first node and the second node, and the selector that couples one of the plurality of taps of the ladder resistance circuit to the inverting input node of the operational amplifier.

In this way, by the selector coupling one of the plurality of taps of the ladder resistance circuit to the inverting input node of the operational amplifier, the first adjustment resistance value and the second adjustment resistance value can be variably set.

Further, in the present exemplary embodiment, the display driver may include the calibration circuit. The calibration circuit may calibrate the first adjustment resistance value and the second adjustment resistance value to perform the gain calibration for the amplifier circuit.

In this way, the calibration circuit can calibrate the gain of the amplifier circuit by calibrating the first adjustment resistance value and the second adjustment resistance value. Additionally, the calibration is performed in each of the amplifier circuits, thereby reducing the gain variation among the amplifier circuits.

Further, in the present exemplary embodiment, the calibration circuit may perform the offset calibration for the amplifier circuit by adjusting the reference voltage input to the non-inverting input node of the operational amplifier so that the output of the amplifier circuit equals the center voltage of the gradation. Additionally, the calibration circuit may perform the gain calibration by adjusting the first adjustment resistance value and the second adjustment resistance value in a state where the predetermined voltage is input to the input node.

In this way, after the offset of the amplifier circuit is calibrated, the gain of the amplifier circuit is calibrated. Accordingly, the gain of the amplifier circuit is accurately calibrated. The offset calibration and the gain calibration are performed in each of the amplifier circuits so that the gain variation among the amplifier circuits is accurately calibrated.

Further, in the present exemplary embodiment, the calibration circuit may adjust the reference voltage so that the output of the amplifier circuit equals the center voltage in a state where the input node is set to the high impedance, to perform the offset calibration.

The input node is set to the high impedance, so that the amplifier circuit is configured as the voltage follower circuit. At this time, by adjusting the reference voltage so that the output of the amplifier circuit equals the center voltage, the offset of the amplifier circuit is canceled.

Additionally, in the present exemplary embodiment, the calibration circuit may perform the positive polarity gain calibration that determines the first adjustment resistance value and the second adjustment resistance value for the positive polarity driving, and the negative polarity gain calibration that determines the first adjustment resistance value and the second adjustment resistance value for the negative polarity driving.

In this way, gain in the positive polarity driving and gain in the negative polarity driving are each accurately calibrated. Depending on the characteristics of the operational amplifier, the first resistance, and the second resistance, the gain errors may be different between the positive polarity driving and the negative polarity driving, but in the present exemplary embodiment, the gain errors are each accurately calibrated.

Additionally, in the present exemplary embodiment, the display driver may include the second D/A converter circuit and the second amplifier circuit. The second D/A converter circuit may convert the second display data to the second gradation voltage. In the second amplifier circuit, the second gradation voltage may be input to the second input node, and the second data voltage may be output. The second amplifier circuit may have the second operational amplifier, the third resistance, the fourth resistance, and the second adjustment resistance circuit. The second reference voltage may be input to the second non-inverting input node of the second operational amplifier. The third resistance may be provided between the second input node and the third node. The fourth resistance may be provided between the fourth node and the second output node of the second operational amplifier. The third adjustment resistance circuit may adjust the third adjustment resistance value between the third node and the second inverting input node of the second operational amplifier, and the fourth adjustment resistance value between the fourth node and the second inverting input node of the second operational amplifier. The calibration circuit may perform the gain calibration so that the amplifier circuit and the second amplifier circuit have an identical gain.

In this way, even when the respective gains of the amplifier circuit and the second amplifier circuit are different due to process variation, the gain calibration is performed to equalize the gains. Accordingly, the error between the data voltage output by the amplifier circuit and the data voltage output by the second amplifier circuit is reduced.

Additionally, the display driver described in the above-described exemplary embodiments includes the D/A converter circuit and the amplifier circuit. The D/A converter circuit converts the display data to the gradation voltage. The gradation voltage is input to the input node of the amplifier circuit, and the amplifier circuit outputs the data voltage. The amplifier circuit has the operational amplifier, the first resistance, the second resistance, and the adjustment resistance circuit. The reference voltage is input to the non-inverting input node of the operational amplifier. The first resistance is provided between the first node and the inverting input node of the operational amplifier. The second resistance is provided between the inverting input node of the operational amplifier and the output node of the operational amplifier. The adjustment resistance circuit is provided between the input node and the first node, and adjusts the resistance value between the input node and the first node.

In this way, by the adjustment resistance circuit adjusting the resistance value between the input node and the first node, the input resistance value of the amplifier circuit serving as the inverting amplifier circuit can be adjusted. Accordingly, the gain of the amplifier circuit is adjusted. Further, this gain adjustment is performed in each of the plurality of amplifier circuits, thereby reducing gain variation among the amplifier circuits.

Further, in the present exemplary embodiment, the display driver may include the calibration circuit. The calibration circuit may calibrate the resistance value of the adjustment resistance circuit to perform the gain calibration for the amplifier circuit.

In this way, the calibration circuit can calibrate the gain of the amplifier circuit by calibrating the resistance value of the adjustment resistance circuit. Additionally, the calibration is performed in each of the amplifier circuits, thereby reducing the gain variation among the amplifier circuits.

Additionally, in the present exemplary embodiment, the calibration circuit may perform the positive polarity gain calibration that determines the resistance value of the adjustment resistance circuit in the positive polarity driving, and the negative polarity gain calibration that determines the resistance value of the adjustment resistance circuit in the negative polarity driving.

In this way, gain in the positive polarity driving and gain in the negative polarity driving are each accurately calibrated. Depending on the characteristics of the operational amplifier, the first resistance, and the second resistance, the gain errors may be different between the positive polarity driving and the negative polarity driving, but in the present exemplary embodiment, the gain errors are each accurately calibrated.

Additionally, the display driver described in the above-described exemplary embodiments includes the arithmetic circuit, the D/A converter circuit, and the amplifier circuit. The arithmetic circuit performs the arithmetic processing for the display data. The D/A converter circuit converts the output data of the arithmetic circuit to the gradation voltage. The gradation voltage is input to the input node of the amplifier circuit, and the amplifier circuit outputs the data voltage. The amplifier circuit has the operational amplifier, the first resistance, and the second resistance. The reference voltage is input to the non-inverting input node of the operational amplifier. The first resistance is provided between the input node and the inverting input node of the operational amplifier. The second resistance is provided between the inverting input node of the operational amplifier and the output node of the operational amplifier.

In this way, the arithmetic processing that corrects the ratio of the first resistance to the second resistance is performed for the display data DT1, so that the gain of the inverting amplifier circuit is substantially adjusted. Further, this gain adjustment is performed in each of the plurality of amplifier circuits, thereby reducing gain variation among the amplifier circuits.

Further, in the present exemplary embodiment, the display driver may include the calibration circuit. The calibration circuit may perform the gain calibration for the amplifier circuit by determining the arithmetic processing so that the ratio of the first resistance to the second resistance is calibrated.

In this way, the calibration circuit determines the arithmetic processing so that the ratio of the first resistance to the second resistance is calibrated, so that the gain of the amplifier circuit is substantially calibrated. Additionally, the calibration is performed in each of the amplifier circuits, thereby reducing the gain variation among the amplifier circuits.

Additionally, in the present exemplary embodiment, the calibration circuit may perform the positive polarity gain calibration that determines the arithmetic processing in the positive polarity driving, and the negative polarity gain calibration that determines the arithmetic processing in the negative polarity driving.

In this way, gain in the positive polarity driving and gain in the negative polarity driving are each accurately calibrated. Depending on the characteristics of the operational amplifier, the first resistance, and the second resistance, the gain errors may be different between the positive polarity driving and the negative polarity driving, but in the present exemplary embodiment, the gain errors are each accurately calibrated.

Further, the electro-optical device described in the above-described exemplary embodiments includes the electro-optical panel and the display driver described above. The display driver drives the electro-optical panel.

The electronic apparatus described in the above-described exemplary embodiments includes the display driver described above.

Although the present exemplary embodiment has been described in detail above, those skilled in the art will easily understand that many modified examples can be made without substantially departing from the novel matter and effects of the present disclosure. All such modified examples are thus included in the scope of the disclosure. For example, terms in the descriptions or drawings given even once along with different terms having identical or broader meanings can be replaced with those different terms in all parts of the descriptions or drawings. All combinations of the present exemplary embodiment and modified examples are also included within the scope of the disclosure. The configurations, the operations, and the like of the display driver, the electro-optical panel, the electro-optical device, the electronic apparatus, and the like, are not limited to those described in the exemplary embodiments, and various modifications can be achieved.

What is claimed is:

1. A display driver, comprising:
   a D/A converter circuit configured to convert display data to a gradation voltage;
   an amplifier circuit that is input with the gradation voltage at an input node, and outputs a data voltage, the amplifier circuit including:
      an operational amplifier that is input with a reference voltage at a non-inverting input node,
      an adjustment resistance circuit provided between the input node and an inverting input node of the operational amplifier,
      a first resistance provided between the input node and a first node of the adjustment resistance,
      a second resistance provided between a second node of the adjustment resistance and an output node of the operational amplifier, and
      wherein the adjustment resistance circuit is configured to adjust a first adjustment resistance value that is a resistance value between the first node and the inverting input node of the operational amplifier, and a second adjustment resistance value that is a resistance value between the second node and the inverting input node of the operational amplifier; and
   a calibration circuit configured to calibrate the first adjustment resistance value and the second adjustment resistance value to perform gain calibration for the amplifier circuit, the calibration circuit being configured to:
      adjust the reference voltage input to the non-inverting input node of the operational amplifier so that an output of the amplifier circuit equals a center voltage of gradation, to perform offset calibration for the amplifier circuit, and
      adjust the first adjustment resistance value and the second adjustment resistance value, in a state where a predetermined voltage is input to the input node, to perform the gain calibration.

2. The display driver according to claim 1, wherein the adjustment resistance circuit includes:
   a first resistance circuit provided between the first node, and the inverting input node of the operational amplifier, and configured to variably set the first adjustment resistance value, and
   a second resistance circuit provided between the second node, and the inverting input node of the operational amplifier, and configured to variably set the second adjustment resistance value.

3. The display driver according to claim 2, wherein the first resistance circuit includes:
   first to n-th resistive elements coupled in series between the first node, and the inverting input node of the operational amplifier, and
   first to n-th switch elements of which an i-th switch element is provided in parallel with an i-th resistive element of the first to n-th resistive elements, n being an integer of 2 or greater and i being an integer from 1 to n, and
   the second resistance circuit includes:
   n+1-th to m-th resistive elements coupled in series between the second node, and the inverting input node of the operational amplifier, and
   n+1-th to m-th switch elements of which a j-th switch element is provided in parallel with a j-th resistive element of n+1-th to m-th resistive elements, m being an integer of n+2 or greater and j being an integer from n+1 to m.

4. The display driver according to claim 1, wherein the adjustment resistance circuit includes:
   a ladder resistance circuit provided between the first node and the second node, and
   a selector configured to couple one of a plurality of taps of the ladder resistance circuit to the inverting input node of the operational amplifier.

5. The display driver according to claim 1, wherein the calibration circuit is configured to, while the input node is in a high impedance state, adjust the reference voltage so that the output of the amplifier circuit equals the center voltage, to perform the offset calibration.

6. The display driver according to claim 1, wherein the calibration circuit is configured to:
   perform positive polarity gain calibration that determines the first adjustment resistance value and the second adjustment resistance value for positive polarity driving, and negative polarity gain calibration that determines the first adjustment resistance value and the second adjustment resistance value for negative polarity driving.

7. The display driver according to claim 1, further comprising:
   a second D/A converter circuit configured to convert second display data to a second gradation voltage, and
   a second amplifier circuit that is input with the second gradation voltage at a second input node, and outputs a second data voltage, the second amplifier circuit including:
      a second operational amplifier that is input with a second reference voltage at a second non-inverting input node,
      a third resistance provided between the second input node and a third node, a fourth resistance provided between a fourth node and a second output node of the second operational amplifier, and a second adjustment resistance circuit configured to adjust a third adjustment resistance value between the third node, and a second inverting input node of the second operational amplifier, and a fourth adjustment resistance value between the fourth node, and the second inverting input node of the second operational amplifier, wherein the calibration circuit is configured to perform the gain calibration so that the amplifier circuit and the second amplifier circuit have an identical gain.

8. A display driver, comprising
a D/A converter circuit configured to convert display data to a gradation voltage; and
an amplifier circuit that is input with the gradation voltage at an input node, and outputs a data voltage, the amplifier circuit including:
   an operational amplifier that is input with a reference voltage at a non-inverting input node,
   an adjustment resistance circuit provided between the input node and an inverting input node of the operational amplifier,
   a first resistance provided between a first node of the adjustment resistance circuit and the inverting input node of the operational amplifier,
   a second resistance provided between the inverting input node of the operational amplifier and an output node of the operational amplifier, and
   wherein the adjustment resistance circuit configured to adjust a resistance value between the input node and the first node; and
a calibration circuit configured to calibrate the first adjustment resistance value and the second adjustment resistance value to perform gain calibration for the amplifier circuit, the calibration circuit being configured to:
   adjust the reference voltage input to the non-inverting input node of the operational amplifier so that an output of the amplifier circuit equals a center voltage of gradation, to perform offset calibration for the amplifier circuit, and
   adjust the first adjustment resistance value and the second adjustment resistance value, in a state where a predetermined voltage is input to the input node, to perform the gain calibration.

9. The display driver according to claim 8, wherein
the calibration circuit is configured to:
   perform positive polarity gain calibration that determines the resistance value of the adjustment resistance circuit for positive polarity driving, and negative polarity gain calibration that determines the resistance value of the adjustment resistance circuit for negative polarity driving.

10. An electro-optical device comprising:
an electro-optical panel; and
a display driver according to claim 1, configured to drive the electro-optical panel.

11. An electronic apparatus comprising the display driver according to claim 1.

12. A display driver, comprising:
a D/A converter circuit configured to convert display data to a gradation voltage;
an amplifier circuit that is input with the gradation voltage at an input node, and outputs a data voltage, the amplifier circuit including:
   an operational amplifier that is input with a reference voltage at a non-inverting input node,
   an adjustment resistance circuit provided between the input node and an inverting input node of the operational amplifier,
   a first resistance provided between the input node and a first node of the adjustment resistance,
   a second resistance provided between a second node of the adjustment resistance and an output node of the operational amplifier, and
   wherein the adjustment resistance circuit is configured to adjust a first adjustment resistance value that is a resistance value between the first node and the inverting input node of the operational amplifier, and a second adjustment resistance value that is a resistance value between the second node and the inverting input node of the operational amplifier; and
a calibration circuit configured to calibrate the first adjustment resistance value and the second adjustment resistance value to perform gain calibration for the amplifier circuit;
a second D/A converter circuit configured to convert second display data to a second gradation voltage; and
a second amplifier circuit that is input with the second gradation voltage at a second input node, and outputs a second data voltage, the second amplifier circuit including:
   a second operational amplifier that is input with a second reference voltage at a second non-inverting input node,
   a third resistance provided between the second input node and a third node,
   a fourth resistance provided between a fourth node and a second output node of the second operational amplifier, and
   a second adjustment resistance circuit configured to adjust a third adjustment resistance value between the third node, and a second inverting input node of the second operational amplifier, and a fourth adjustment resistance value between the fourth node, and the second inverting input node of the second operational amplifier; wherein:
the calibration circuit is configured to perform the gain calibration so that the amplifier circuit and the second amplifier circuit have an identical gain.

* * * * *